US008181882B2

(12) United States Patent
Hata et al.

(10) Patent No.: US 8,181,882 B2
(45) Date of Patent: May 22, 2012

(54) SEMICONDUCTOR DEVICE

(75) Inventors: Yuki Hata, Kanagawa (JP); Koichiro Kamata, Kanagawa (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 297 days.

(21) Appl. No.: 12/572,710

(22) Filed: Oct. 2, 2009

(65) Prior Publication Data

US 2010/0084475 A1 Apr. 8, 2010

(30) Foreign Application Priority Data

Oct. 3, 2008 (JP) .................................. 2008-258208

(51) Int. Cl.
*G06K 19/06* (2006.01)
(52) U.S. Cl. ....................................................... 235/492
(58) Field of Classification Search .................. 235/451, 235/487, 492; 257/678, 679
See application file for complete search history.

(56) References Cited

U.S. PATENT DOCUMENTS

| 5,175,418 | A  | * | 12/1992 | Tanaka ........................... 235/439 |
| 6,375,082 | B1 | * | 4/2002  | Kobayashi et al. ............ 235/492 |
| 6,636,118 | B1 |   | 10/2003 | Kusano et al. |
| 7,712,663 | B2 | * | 5/2010  | Sukegawa et al. ............ 235/451 |
| 7,907,902 | B2 |   | 3/2011  | Kato et al. |
| 2007/0272759 | A1 |   | 11/2007 | Kato |
| 2008/0094180 | A1 |   | 4/2008  | Kato et al. |
| 2008/0143531 | A1 |   | 6/2008  | Tadokoro |
| 2008/0164978 | A1 |   | 7/2008  | Tanada |
| 2008/0174408 | A1 |   | 7/2008  | Takahashi |

FOREIGN PATENT DOCUMENTS

| JP | 5-235677 | 9/1993 |
| JP | 2005-190485 | 3/2001 |
| JP | 2001-332567 | 11/2001 |
| JP | 2003-8030 | 1/2003 |
| JP | 2003-218712 | 7/2003 |
| JP | 2007-306491 | 11/2007 |
| JP | 2008-193668 | 8/2008 |
| WO | WO 01/18865 A1 | 3/2001 |

OTHER PUBLICATIONS

International Search Report re application No. PCT/JP2009/065971, dated Nov. 17, 2009.
Written Opinion re application No. PCT/JP2009/065971, dated Nov. 17, 2009.

* cited by examiner

*Primary Examiner* — Jamara Franklin
(74) *Attorney, Agent, or Firm* — Husch Blackwell LLP

(57) ABSTRACT

The semiconductor device includes an antenna 101, a rectifier circuit 102, a first protection circuit 107, and a second protection circuit 108. The antenna 101 generates AC voltage. The rectifier circuit 102 rectifies the AC voltage and generates internal voltage Vin. The first protection circuit 107 includes a first diode 201 and a second diode 202. The second protection circuit 108 includes a capacitor 203 and a transistor 204. In the case where the absolute value of the AC voltage generated in the antenna 101 is larger than a certain value, the first protection circuit 107 cuts the surplus. The second protection circuit 108 functions in the case where the level of the internal voltage Vin generated in the rectifier circuit 102 is high. By changing resonant frequency, the second protection circuit 108 can decrease the number of signals input to the semiconductor device.

22 Claims, 12 Drawing Sheets

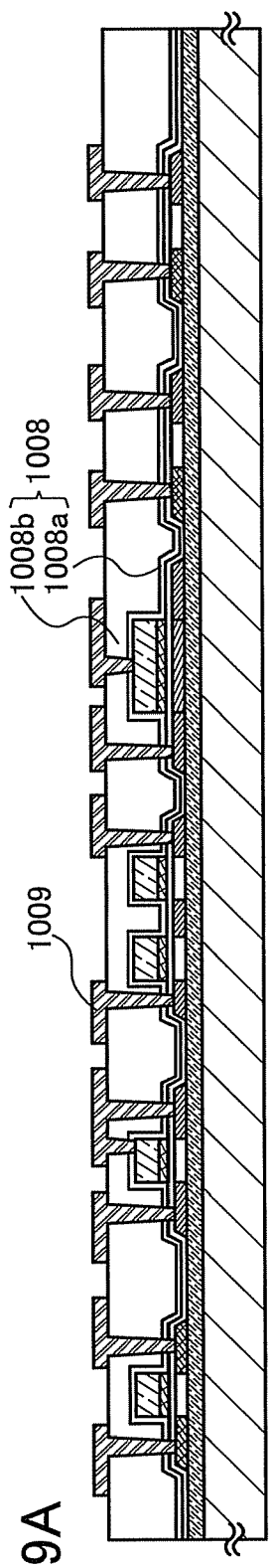
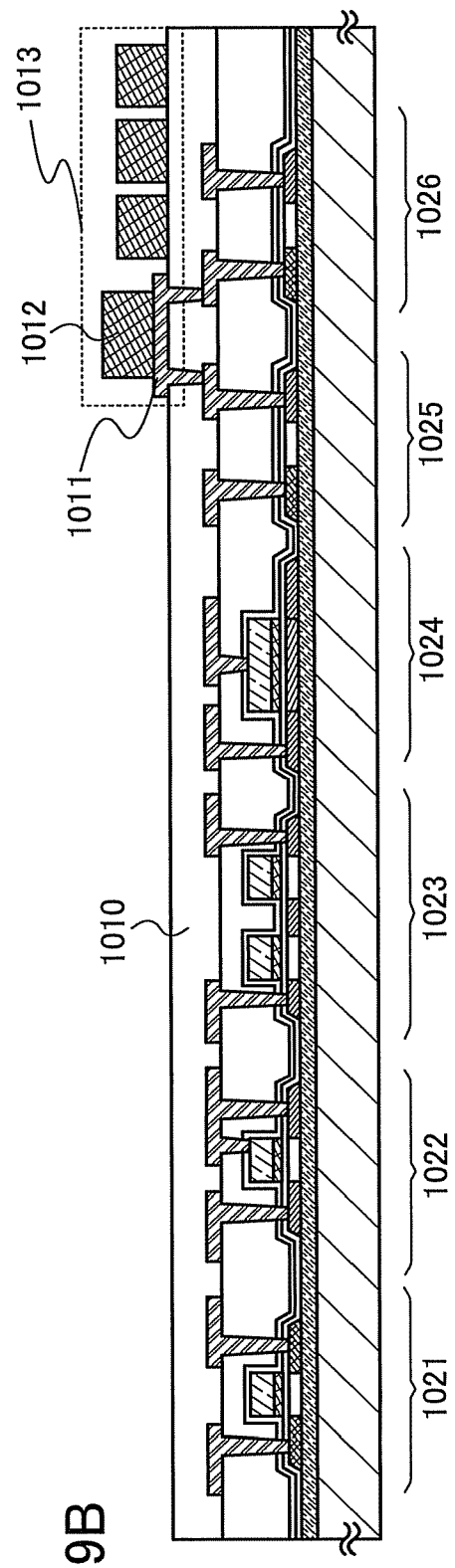
FIG. 9A
FIG. 9B

2000

SEMICONDUCTOR DEVICE

TECHNICAL FIELD

The present invention relates to semiconductor devices which are formed using semiconductor elements and have wireless communication functions.

BACKGROUND ART

Semiconductor devices having wireless communication functions for transmitting and receiving data wirelessly have been put into practical use in a variety of fields. Semiconductor devices having wireless communication functions have been expected as new communication information terminals, and the market of such semiconductor devices has been expected to become much larger. In semiconductor devices having wireless communication functions, which are put into practical use, antennas and integrated circuits formed using semiconductor elements are formed over the same substrates. Further, semiconductor devices having wireless communication functions are also referred to as wireless tags, RF (radio frequency) tags, RFID (radio frequency identification) tags, IC (integrated circuit) tags, or ID (identification) tags.

A semiconductor device having a wireless communication function can communicate with a wireless communication device which is a power supply source and a transmitting and receiving device (also referred to as an interrogator or a reader/writer). The structure of a conventional semiconductor device having a wireless communication function is described below with reference to a block diagram in FIG. 10.

The conventional semiconductor device having a wireless communication function (also simply referred to as a semiconductor device), which is illustrated in FIG. 10, includes an antenna 11, a rectifier circuit 12, a demodulation circuit 13, a constant voltage circuit 14, a logic circuit 15, and a modulation circuit 16. When the semiconductor device receives radio waves transmitted from a wireless communication device, AC voltage is generated in the internal antenna 11. The generated AC voltage is applied to the rectifier circuit 12 and the demodulation circuit 13. The AC voltage rectified in the rectifier circuit 12 is converted into DC voltage in the constant voltage circuit 14 and is applied to the logic circuit 15. The AC voltage is demodulated in the demodulation circuit 13, and a demodulated signal is input to the logic circuit 15. Analysis of the signal and generation of a response signal are performed in the logic circuit 15, and the response signal is output to the modulation circuit 16. The modulation circuit 16 performs load modulation on the antenna 11 by using the response signal, so that a signal is transmitted to the wireless communication device. Thus, wireless communication is performed between the semiconductor device and the wireless communication device.

In general, power supplied from a wireless communication device to a semiconductor device attenuates in proportion to the square of a distance between the semiconductor device and the wireless communication device (hereinafter referred to as a communication distance). That is, the amount of power supplied to the semiconductor device varies depending on the communication distance.

When the communication distance is long, the amount of power supplied to the semiconductor device is decreased. Needless to say, the level of DC voltage generated in accordance with the power is lowered, so that an integrated circuit cannot be operated. Therefore, in order to improve the communication distance, semiconductor devices which can generate desired drive power supply voltage even in the case where the communication distance is long have actively developed (for example, see Reference 1). Specifically, semiconductor devices which can amplify input signals have actively developed.

REFERENCE

Reference 1: Japanese Published Patent Application No. 2008-193668

DISCLOSURE OF INVENTION

In a semiconductor device which can amplify input signals, the communication distance can be increased as compared to a conventional semiconductor device. On the other hand, when the communication distance is short, for example, the semiconductor device is in contact with a wireless communication device, or when a signal having high amplitude is supplied to the semiconductor device by unwanted radiation from an external electronic device or the like, high AC voltage which deviates from a predetermined range is generated in an antenna. When the high AC voltage which deviates from the predetermined range is generated, signals from the wireless communication device cannot be demodulated accurately in the semiconductor device and the semiconductor device malfunctions, so that a semiconductor element in the semiconductor device deteriorates. In addition, in the worst case, dielectric breakdown is caused by sharp rise in voltage applied to the semiconductor element, so that the semiconductor element is damaged.

In particular, in recent years, withstand voltage of semiconductor elements has tended to be lowered due to miniaturization of semiconductor manufacturing processes.

One embodiment of the present invention is made in view of the foregoing problems. A semiconductor device having a wireless communication function, which is normally operated even in the case where a signal having high amplitude is supplied to the semiconductor device and has high reliability, is provided.

A semiconductor device according to one embodiment of the present invention includes a first protection circuit having a first diode and a second diode and a second protection circuit having a capacitor and a transistor. An anode of the first diode is electrically connected to an antenna, and a cathode of the first diode is grounded. A cathode of the second diode is electrically connected to the antenna, and an anode of the second diode is grounded. The second diode is connected in parallel with the first diode. One of electrodes of the capacitor is electrically connected to the antenna. A gate electrode of the transistor is electrically connected to an output terminal of a rectifier circuit. One of a source electrode and a drain electrode of the transistor is electrically connected to the other of the electrodes of the capacitor. The other of the source electrode and the drain electrode of the transistor is grounded.

Note that since a source electrode and a drain electrode of a transistor change depending on the structure, the operating condition, and the like of the transistor, it is difficult to define which is a source electrode or a drain electrode. Therefore, in this document, one of electrodes is referred to as one of a source electrode and a drain electrode, and the other of the electrodes is referred to as the other of the source electrode and the drain electrode.

One embodiment of the present invention is described below. A semiconductor device includes an antenna for receiving signals from a wireless communication device and for generating AC voltage, a rectifier circuit for rectifying the generated AC voltage and for generating DC voltage, a first protection circuit, and a second protection circuit.

The first protection circuit includes a first diode and a second diode. An anode of the first diode is electrically connected to the antenna, and a cathode of the first diode is grounded. A cathode of the second diode is electrically connected to the antenna, and an anode of the second diode is grounded. Note that the first diode and the second diode are connected in parallel with each other. In addition, the number of the first diodes and the number of the second diodes may be both plural. In that case, the number of the first diodes and the number of the second diodes are the same, and the first diodes and the second diodes are connected in parallel with each other. Note that the connection between the first diodes and the connection between the second diodes are not limited to serial connection or parallel connection, and the first diodes and the second diodes are connected in a given way. The first diode and the second diode or a plurality of the first diodes and a plurality of the second diodes are brought into conduction when the amplitude of AC voltage generated in the antenna is first amplitude (forward voltage drop) or higher.

A second protection circuit includes a capacitor and a transistor. One of electrodes of the capacitor is electrically connected to the antenna. A gate electrode of the transistor is electrically connected to an output terminal of the rectifier circuit. One of a source electrode and a drain electrode of the transistor is electrically connected to the other of the electrodes of the capacitor. The other of the source electrode and the drain electrode of the transistor is grounded. Note that the transistor is turned on when the amplitude of the AC voltage generated in the antenna is second amplitude or higher. Thus, the capacitor provided between the antenna and the transistor functions as a resonant capacitor, and the number of signals input to the semiconductor device is decreased by changing resonant frequency. Further, the second protection circuit can include a voltage divider circuit for outputting a potential based on an output potential of the rectifier circuit (also referred to as internal voltage Vin) or a potential based on a ground potential, a selection circuit to which an output potential of the voltage divider circuit is input and which outputs a potential based on the rectifier circuit or the potential based on the ground potential, and a low pass filter for preventing noise from entering the output potential of the rectifier circuit.

Further, the first amplitude may be designed so as to be higher than the second amplitude.

Furthermore, a semiconductor device which includes a demodulation circuit, a constant voltage circuit, a logic circuit, and a modulation circuit, in addition to the first protection circuit and the second protection circuit, is also one embodiment of the present invention. An input terminal of the demodulation circuit is electrically connected to the antenna. An input terminal of the constant voltage circuit is electrically connected to the output terminal of the rectifier circuit. A first input terminal of the logic circuit is electrically connected to an output terminal of the demodulation circuit, and a second input terminal of the logic circuit is electrically connected to an output terminal of the constant voltage circuit. An input terminal of the modulation circuit is electrically connected to an output terminal of the logic circuit, and an output terminal of the modulation circuit is electrically connected to the antenna.

Note that a variety of transistors can be used as the transistor included in the semiconductor device. Thus, there is no particular limitation on types of transistors which can be used. Therefore, a thin film transistor including a semiconductor film typified by silicon, a transistor formed using a semiconductor substrate or an SOI substrate, a MOS transistor, a junction transistor, a bipolar transistor, a transistor including a compound semiconductor such as ZnO or InGaZnO, a transistor including an organic semiconductor or carbon nanotube, or other transistors can be used. Note that the semiconductor film may contain hydrogen or halogen.

In a similar manner, a variety of diodes can be used as the diodes included in the semiconductor device. Thus, there is no particular limitation on types of diodes which can be used. Therefore, a PN diode in which a PN junction of a semiconductor is utilized, a PIN diode in which a semiconductor having high electric resistance is interposed between a PN junction, a Schottky diode in which a Schottky effect on a surface where a metal and a semiconductor are bonded to each other is utilized, a diode-connected transistor, or other diodes can be used.

In addition, a transistor or a diode can be formed using a variety of substrates, and there is no particular limitation on types of substrates. Therefore, for example, a transistor can be provided for a single crystal substrate, an SOI substrate, a glass substrate, a quartz substrate, a plastic substrate, a paper substrate, a cellophane substrate, or the like. Further, after a transistor or a diode is formed using one substrate, the transistor or the diode may be transferred to another substrate.

In a semiconductor device according to one embodiment of the present invention, when a first protection circuit functions, application of overvoltage to a circuit such as a rectifier circuit included in the semiconductor device can be prevented. Further, in the semiconductor device according to one embodiment of the present invention, when a second protection circuit functions, the number of input signals can be decreased. Therefore, a semiconductor device having a wireless communication function, which is normally operated even in the case where a signal having high amplitude is supplied to the semiconductor device and has high reliability, can be provided.

BRIEF DESCRIPTION OF DRAWINGS

In the accompanying drawings:

FIGS. 9A and 9B are cross-sectional views illustrating examples of manufacturing steps of the semiconductor device according to one embodiment of the present invention;

BEST MODE FOR CARRYING OUT THE INVENTION

Figure 1:
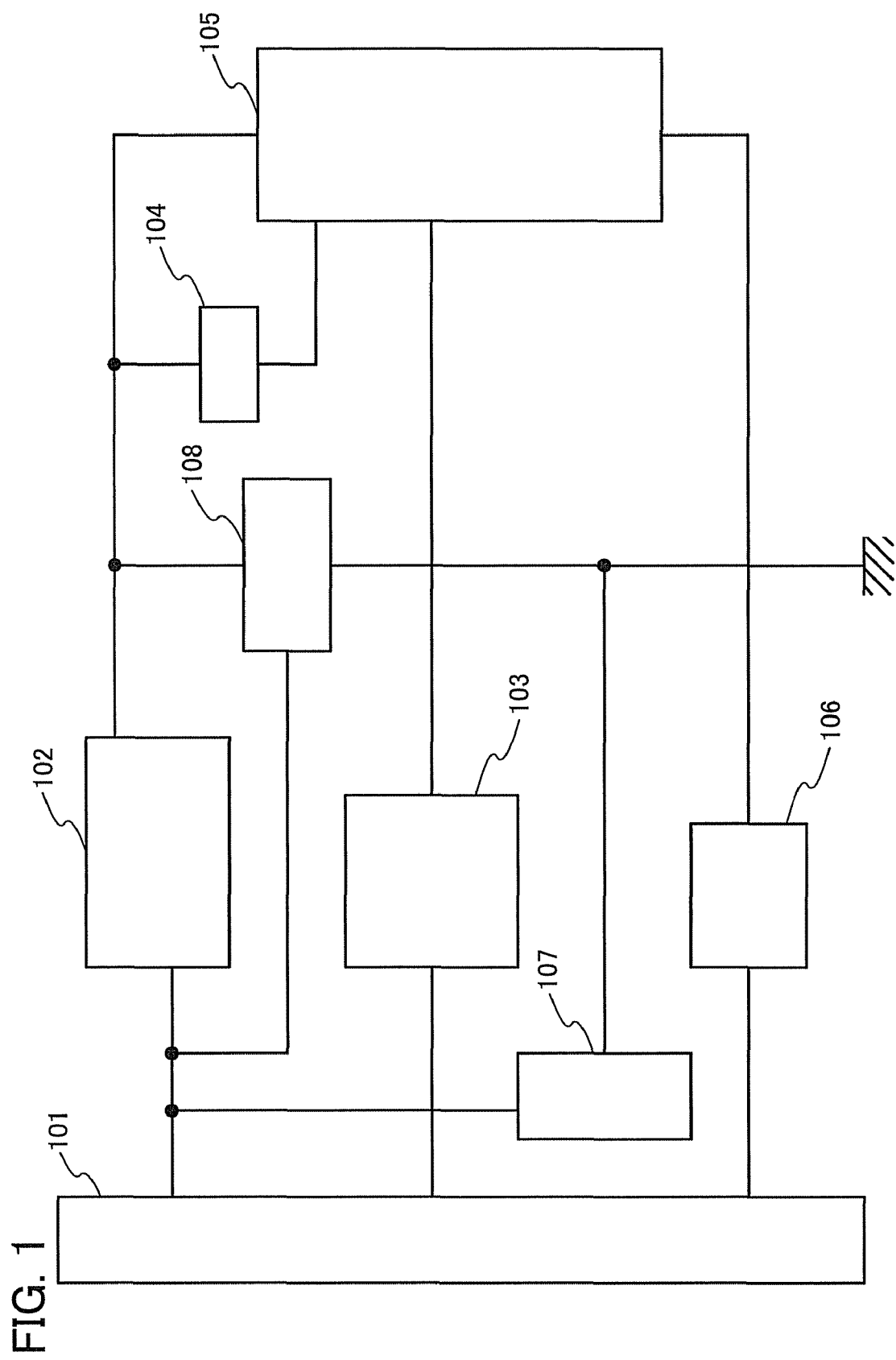
FIG. 1 is a block diagram illustrating a structural example of a semiconductor device according to one embodiment of the present invention.

Hereinafter, embodiments of the present invention will be described with reference to the drawings. Note that the present invention can be implemented in various different ways and it will be readily appreciated by those skilled in the art that modes and details of the present invention can be changed in various ways without departing from the spirit and scope of the present invention. Therefore, the present invention should not be construed as being limited to the following description of the embodiments. Note that in all the drawings for illustrating the embodiments, the same portions or portions having similar functions are denoted by the same reference numerals, and description thereof is not repeated.

Embodiment 1

In this embodiment, circuits which can be used for a semiconductor device of the present invention are described with reference to FIG. 1 and FIG. 2.

FIG. 1 is a block diagram illustrating the structure of a semiconductor device. The semiconductor device includes an antenna 101, a rectifier circuit 102, a demodulation circuit 103, a constant voltage circuit 104, a logic circuit 105, a modulation circuit 106, a first protection circuit 107, and a second protection circuit 108. The antenna 101 generates AC voltage. The rectifier circuit 102 rectifies the AC voltage and generates internal voltage Vin. The demodulation circuit 103 demodulates a signal from the AC voltage generated in the antenna 101 and generates an internal signal. The constant voltage circuit 104 makes the internal voltage Vin generated in the rectifier circuit 102 into constant voltage and outputs the voltage as power supply voltage Vdd. The logic circuit 105 analyzes signals by using the power supply voltage Vdd generated in the constant current circuit 104 and the demodulation signal generated in the demodulation circuit 103 and generates a response signal. The modulation circuit 106 modulates a signal from the logic circuit 105 and outputs the modulation signal to the antenna 101. The first protection circuit 107 functions in the case where the amplitude of the AC voltage generated in the antenna 101 is high. In the case where the absolute value of the AC voltage generated in the antenna 101 is larger than a certain value, the first protection circuit 107 cuts the surplus. The second protection circuit 108 functions in the case where the level of the internal voltage Vin generated in the rectifier circuit 102 is high. By changing resonant frequency, the second protection circuit 108 decreases the number of signals input to the semiconductor device.

The structures of the antenna 101, the rectifier circuit 102, the first protection circuit 107, and the second protection circuit 108 are described below with reference to FIG. 2.

Figure 2:
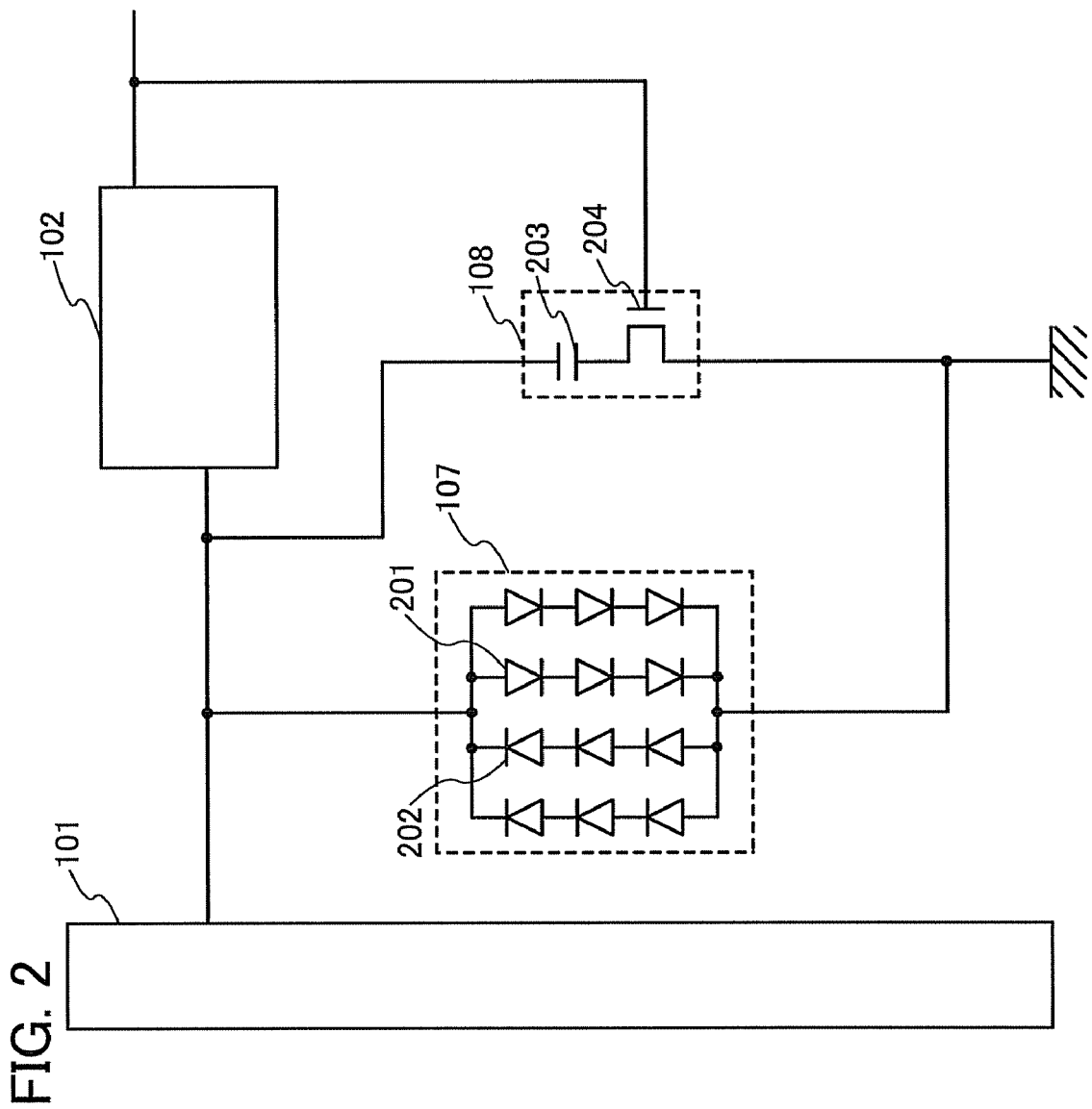
FIG. 2 is a diagram illustrating a structural example of the semiconductor device according to one embodiment of the present invention.

The first protection circuit 107 illustrated in FIG. 2 includes a first terminal and a second terminal. Note that the first terminal of the first protection circuit 107 is electrically connected to the antenna 101, and the second terminal of the first protection circuit 107 is grounded. The first protection circuit 107 includes a first diode 201 whose anode is provided on an antenna 101 side and a second diode 202 whose cathode is provided on the antenna 101 side. In FIG. 2, three first diodes 201 which are connected in series and three second diodes 202 which are connected in series are connected in parallel by two columns; however, the structure of the first protection circuit 107 is not limited to this structure. As the structure of the first protection circuit 107, any structure can be used as long as the number of the first diodes 201 and the number of the second diodes 202 are the same and the first diodes 201 and the second diodes 202 are connected in parallel with each other. Note that the connection between the first diodes 201 and the connection between the second diodes 202 are not limited to serial connection or parallel connection, and the first diodes 201 and the second diodes 202 are connected in a given way.

The second protection circuit 108 illustrated in FIG. 2 includes first to third terminals. Note that the first terminal of the second protection circuit 108 is electrically connected to an output terminal of the rectifier circuit 102; the second terminal of the second protection circuit 108 is electrically connected to the antenna 101; the third terminal of the second protection circuit 108 is grounded. The second protection circuit 108 includes a capacitor 203 and a transistor 204. One of electrodes of the capacitor 203 is electrically connected to the antenna 101. A gate electrode of the transistor 204 is electrically connected to the output terminal of the rectifier circuit 102. One of a source electrode and a drain electrode of the transistor 204 is electrically connected to the other of the electrodes of the capacitor 203. The other of the source electrode and the drain electrode of the transistor 204 is grounded.

The first protection circuit 107 functions when the amplitude of the AC voltage generated in the antenna 101 is high. That is, the first diode 201 is brought into conduction when the AC voltage is higher than or equal to certain positive voltage, and the second diode is brought into conduction when the AC voltage is lower than or equal to certain negative voltage. When the first diode 201 or the second diode 202 is brought into conduction, AC voltage which is input to the rectifier circuit 102 and has a certain absolute value or more can be cut.

In addition, when the plurality of first diodes 201 are connected in series and the plurality of second diodes 202 are connected in series, the operating voltage of the first protection circuit 107 is determined by the number of diodes which are connected in series. Further, when the plurality of first diodes 201 which are connected in series and the plurality of second diodes 202 which are connected in series are connected in parallel, the amount of current which can flow simultaneously can be increased.

The second protection circuit 108 functions when the internal voltage Vin generated in the rectifier circuit 102 is higher than or equal to the threshold voltage of the transistor 204. That is, when the transistor 204 is turned on, the capacitor 203 functions as a resonant capacitor and the number of signals input to the semiconductor device can be decreased.

Further, as the transistor 204, a transistor having current drive capability as high as possible so that dielectric breakdown, deterioration, or the like does not easily occur is preferably used. Note that the threshold voltage of the transistor 204 can be controlled by setting the channel length of the transistor 204 optionally.

The first protection circuit 107 cuts the surplus of the AC voltage generated in the antenna 101 whose absolute value is larger than a certain value in accordance with an input signal. Therefore, when the first protection circuit 107 functions with respect to a signal transmitted by amplitude modulation, there is a possibility that a signal cannot be demodulated accurately from the AC voltage in the demodulation circuit 103. On the other hand, when the second protection circuit 108 which can decrease the number of input signals by changing resonant frequency functions, the signal transmitted by amplitude modulation itself is held though the amplitude of the AC voltage generated in the antenna 101 is low. Thus, the signal can be demodulated accurately in the demodulation circuit 103.

The second protection circuit 108 controls overvoltage in accordance with the internal voltage Vin which is output from the rectifier circuit 102. Therefore, there is a possibility that input of overvoltage to the rectifier circuit 102 cannot be avoided, so that excessive heat generation or deterioration, and damage in a semiconductor element included in the rectifier circuit 102 occur. In addition, there is also a possibility that dielectric breakdown of the transistor 204 occur because the internal voltage Vin is applied from the rectifier circuit 102 to the gate electrode of the transistor 204. On the other hand, when the first protection circuit 107 which cuts the surplus of the AC voltage generated in the antenna 101 whose absolute value is larger than a certain value in accordance with an input signal functions, overvoltage is not applied to the rectifier circuit 102. Accordingly, excessive heat generation or deterioration, and damage in the semiconductor element included in the rectifier circuit 102, or dielectric breakdown of the transistor 204 can be prevented.

As described above, the first protection circuit 107 and the second protection circuit 108 can compensate functions with each other. Further, it is preferable to design the semiconductor device such that the second protection circuit 108 functions when the amplitude of the AC voltage generated in the antenna 101 exceeds second amplitude and the first protection circuit 107 functions when the amplitude of the AC voltage generated in the antenna 101 exceeds first amplitude which is higher than the second amplitude. With such design, excessive heat generation or deterioration, and damage in semiconductor elements included in circuits provided after the rectifier circuit 102 can be prevented, deterioration and damage in a semiconductor element included in the second protection circuit 108 can be prevented by the first protection circuit 107, and an input signal can be demodulated accurately.

Figure 3:
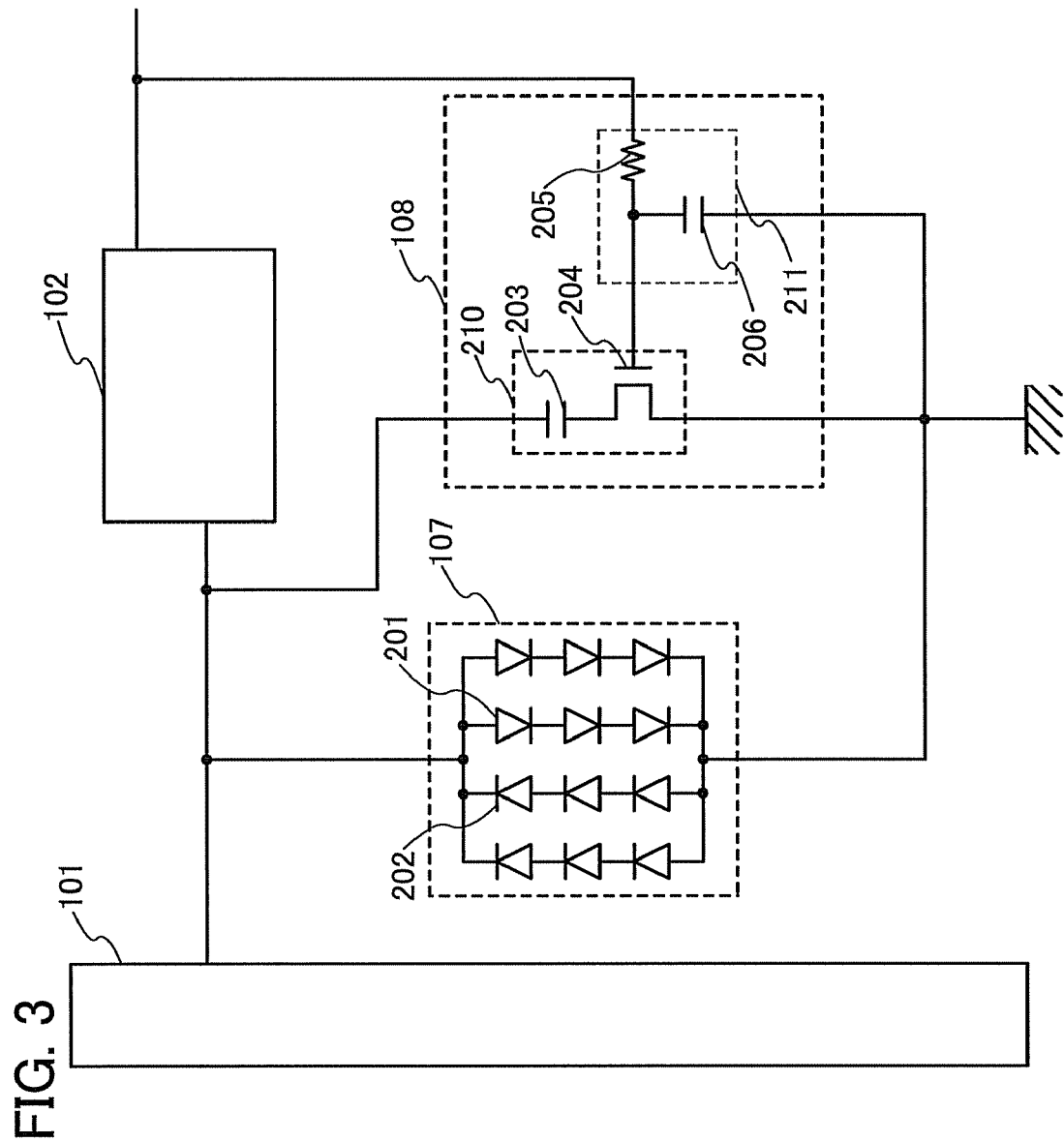
FIG. 3 is a diagram illustrating a structural example of the semiconductor device according to one embodiment of the present invention.

Further, as illustrated in FIG. 3, by adding a low pass filter 211 to the second protection circuit 108 having the structure in FIG. 2, the second protection circuit can include an overvoltage control circuit 210 and the low pass filter 211. The low pass filter 211 includes a filter resistor 205 and a filter capacitor 206. One of ends of the filter resistor 205 is electrically connected to the output terminal of the rectifier circuit 102, and the other of the ends of the filter resistor 205 is electrically connected to the gate electrode of the transistor 204. One of electrodes of the filter capacitor 206 is electrically connected to the gate electrode of the transistor 204 and the other of the ends of the filter resistor 205, and the other of the electrodes of the filter capacitor 206 is grounded. With the low pass filter 211, the AC voltage generated in the antenna 101 can be prevented from entering as noise of the internal voltage Vin.

By providing the first protection circuit 107 and the second protection circuit 108 in a semiconductor device having a wireless communication function, a semiconductor device which is normally operated even in the case where a signal having high amplitude is supplied to the semiconductor device and has high reliability can be obtained.

Embodiment 2

In this embodiment, structures of circuits which can be used for an antenna, a rectifier circuit, a first protection circuit, and a second protection circuit, which are different from those of Embodiment 1, are described with reference to FIG. 4. Note that since the first protection circuit 107 illustrated in FIG. 4 is the same as the first protection circuit 107 illustrated in FIG. 2, the description in Embodiment 1 is incorporated in the description of the first protection circuit 107 in FIG. 4.

Figure 4:
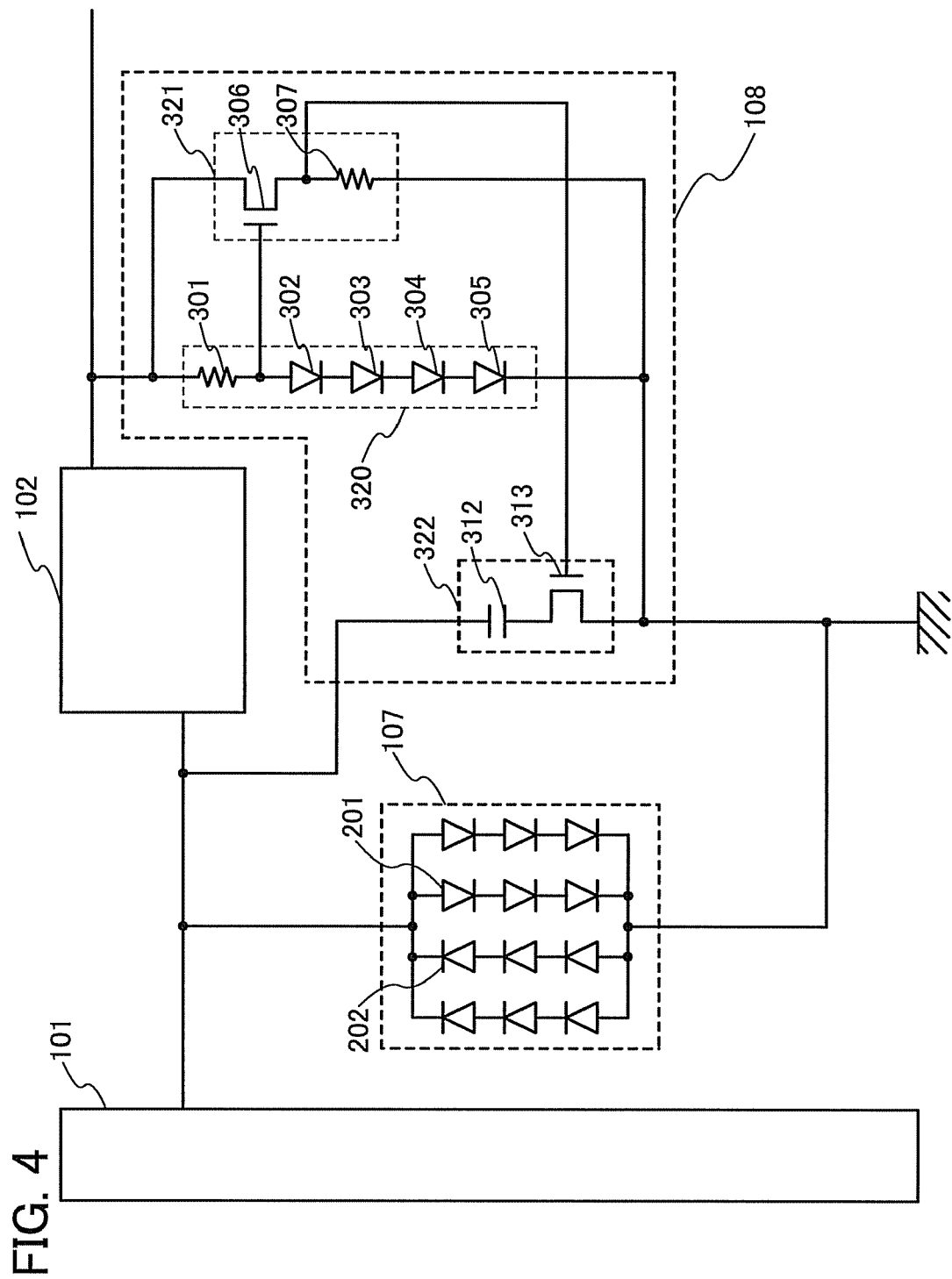
FIG. 4 is a diagram illustrating a structural example of a semiconductor device according to one embodiment of the present invention.

The structure of the second protection circuit illustrated in FIG. 4 is described in detail below.

The second protection circuit 108 illustrated in FIG. 4 includes first to third terminals. Note that the first terminal of the second protection circuit 108 is electrically connected to the output terminal of the rectifier circuit 102; the second terminal of the second protection circuit 108 is electrically connected to the antenna 101; the third terminal of the second protection circuit 108 is grounded.

The second protection circuit 108 includes a voltage divider circuit 320 having first to third terminals, a selection circuit 321 having first to fourth terminals, and an overvoltage control circuit 322 having first to third terminals.

The first terminal of the voltage divider circuit 320 is electrically connected to the output terminal of the rectifier circuit 102, and the second terminal of the voltage divider circuit 320 is grounded.

The first terminal of the selection circuit 321 is electrically connected to the output terminal of the rectifier circuit 102. The second terminal of the selection circuit 321 is electrically connected to the third terminal of the voltage divider circuit 320. The third terminal of the selection circuit 321 is grounded.

The first terminal of the overvoltage control circuit 322 is electrically connected to the fourth terminal of the selection circuit 321. The second terminal of the overvoltage control circuit 322 is electrically connected to the antenna 101. The third terminal of the overvoltage control circuit 322 is grounded.

The voltage divider circuit 320 includes a first resistor 301 and voltage divider diodes 302, 303, 304, and 305. One of ends of the first resistor 301 is electrically connected to the output terminal of the rectifier circuit 102. An anode of each of the voltage divider diodes 302, 303, 304, and 305 is electrically connected to the other of the ends of the first resistor 301, and a cathode of each of the voltage divider diodes 302, 303, 304, and 305 is grounded.

The selection circuit 321 includes a p-channel transistor 306 and a second resistor 307. A gate electrode of the p-channel transistor 306 is electrically connected to the other of the ends of the first resistor 301 and the anode of each of the voltage divider diodes 302, 303, 304, and 305. One of a source electrode and a drain electrode of the p-channel transistor 306 is electrically connected to the output terminal of the rectifier circuit 102. One of ends of the second resistor 307 is electrically connected to the other of the source electrode and the drain electrode of the p-channel transistor 306, and the other of the ends of the second resistor 307 is grounded.

The overvoltage control circuit 322 includes a capacitor 312 and an n-channel transistor 313. One of electrodes of the capacitor 312 is electrically connected to the antenna 101. A gate electrode of the n-channel transistor 313 is electrically connected to the other of the source electrode and the drain electrode of the p-channel transistor 306 and the one of the ends of the second resistor 307. One of a source electrode and a drain electrode of the n-channel transistor 313 is electrically connected to the other of the electrodes of the capacitor 312. The other of the source electrode and the drain electrode of the n-channel transistor 313 is grounded.

The voltage divider circuit 320 outputs a potential divided by the first resistor 301 and the voltage divider diodes 302, 303, 304, and 305 from the third terminal. Specifically, the voltage divider circuit 320 outputs a potential based on the internal voltage Vin or a ground potential from the third terminal.

The selection circuit 321 outputs a potential divided by the p-channel transistor 306 and the second resistor 307 from the fourth terminal. Specifically, the selection circuit 321 outputs a potential based on the internal voltage Vin or the ground potential from the fourth terminal.

In the overvoltage control circuit 322, the n-channel transistor 313 is turned on when the output potential from the selection circuit 321 is the potential based on the internal voltage Vin. Thus, the capacitor 312 functions as a resonant capacitor, and the number of signals input to the semiconductor device can be decreased.

Note that although an example in which four diodes are used for the voltage divider circuit 320 is described in FIG. 4, the present invention is not limited to this structure. That is, the number of diodes used as voltage divider diodes can be set optionally. Further, in order to minimize increase in circuit area, diode-connected transistors whose channels are formed when the transistors are on are preferably used as the voltage divider diodes 302, 303, 304, and 305.

The operation of the second protection circuit 108 in FIG. 4 is described in detail below.

First, the case is described in which the internal voltage Vin which is output from the rectifier circuit 102 is lower than forward voltage drop of the voltage divider diodes 302, 303, 304, and 305.

An output potential Vout of the voltage divider circuit 320 in the case where the resistance value of the first resistor 301 and the resistance values of the voltage divider diodes 302, 303, 304, and 305 are denoted by $R_{301}$, $R_{302}$, $R_{303}$, $R_{304}$, and $R_{305}$, respectively, is expressed as Formula 1.

$$Vout = Vin - Vin\left(\frac{R_{301}}{R_{301} + R_{302} + R_{303} + R_{304} + R_{305}}\right) \quad \text{(Formula 1)}$$

Here, the voltage divider diodes 302, 303, 304, and 305 are not brought into conduction because voltage which is applied is lower than the forward voltage drop. Therefore, the resistance values $R_{302}$, $R_{303}$, $R_{304}$, and $R_{305}$ of the voltage divider diodes 302, 303, 304, and 305 are much larger than the resistance value $R_{301}$ of the first resistor 301. In addition, since the resistance value $R_{301}$ of the first resistor 301 is constant, the output potential Vout of the voltage divider circuit 320 is the potential based on the internal voltage Vin. The output potential Vout of the voltage divider circuit 320 (the potential based on the internal voltage Vin) is applied to the gate electrode of the p-channel transistor 306 in the selection circuit 321.

In this case, the p-channel transistor 306 is turned off because the potential based on the internal voltage Vin is applied to both the gate electrode and the drain electrode of the p-channel transistor 306. Thus, the resistance value of the p-channel transistor 306 in the selection circuit 321 is much larger than the resistance value of the second resistor 307. Since the resistance value of the second resistor 307 is constant, the output potential of the selection circuit 321 is the potential based on the ground potential.

The ground potential is theoretically 0 V and is applied to the gate electrode of the n-channel transistor 313. Therefore, the n-channel transistor 313 is turned off, and current does not easily flow between the source electrode and the drain electrode of the n-channel transistor 313. Accordingly, the second protection circuit 108 does not function.

Next, the case is described in which the internal voltage Vin which is output from the rectifier circuit 102 is higher than the forward voltage drop of the voltage divider diodes 302, 303, 304, and 305.

The voltage divider diodes 302, 303, 304, and 305 are brought into conduction because voltage which is applied is higher than the forward voltage drop. Therefore, the resistance values of the voltage divider diodes 302, 303, 304, and 305 are much smaller than the resistance value of the first resistor 301. Accordingly, the potential based on the ground potential is applied to the gate electrode of the p-channel transistor 306 in the selection circuit 321.

In this case, the p-channel transistor 306 is turned on because the ground potential is applied to the gate electrode of the p-channel transistor 306. Thus, the resistance value of the p-channel transistor 306 in the selection circuit 321 is much smaller than the resistance value of the second resistor 307. Therefore, the output potential Vout of the selection circuit 321 is the potential based on the internal voltage Vin. This potential is applied to the gate electrode of the n-channel transistor 313, so that the n-channel transistor 313 is turned on. Thus, the capacitor 312 functions as a resonant capacitor, and the number of signals input to the semiconductor device is decreased.

In the second protection circuit 108 described in Embodiment 1, whether the second protection circuit 108 functions is determined by the one transistor 204 (see FIG. 2); however, in the second protection circuit 108 described in this embodiment, whether the second protection circuit functions is determined by the plurality of semiconductor elements (see FIG. 4). Therefore, variations in semiconductor devices which are formed can be suppressed, so that semiconductor devices having high reliability can be provided.

Figure 5:
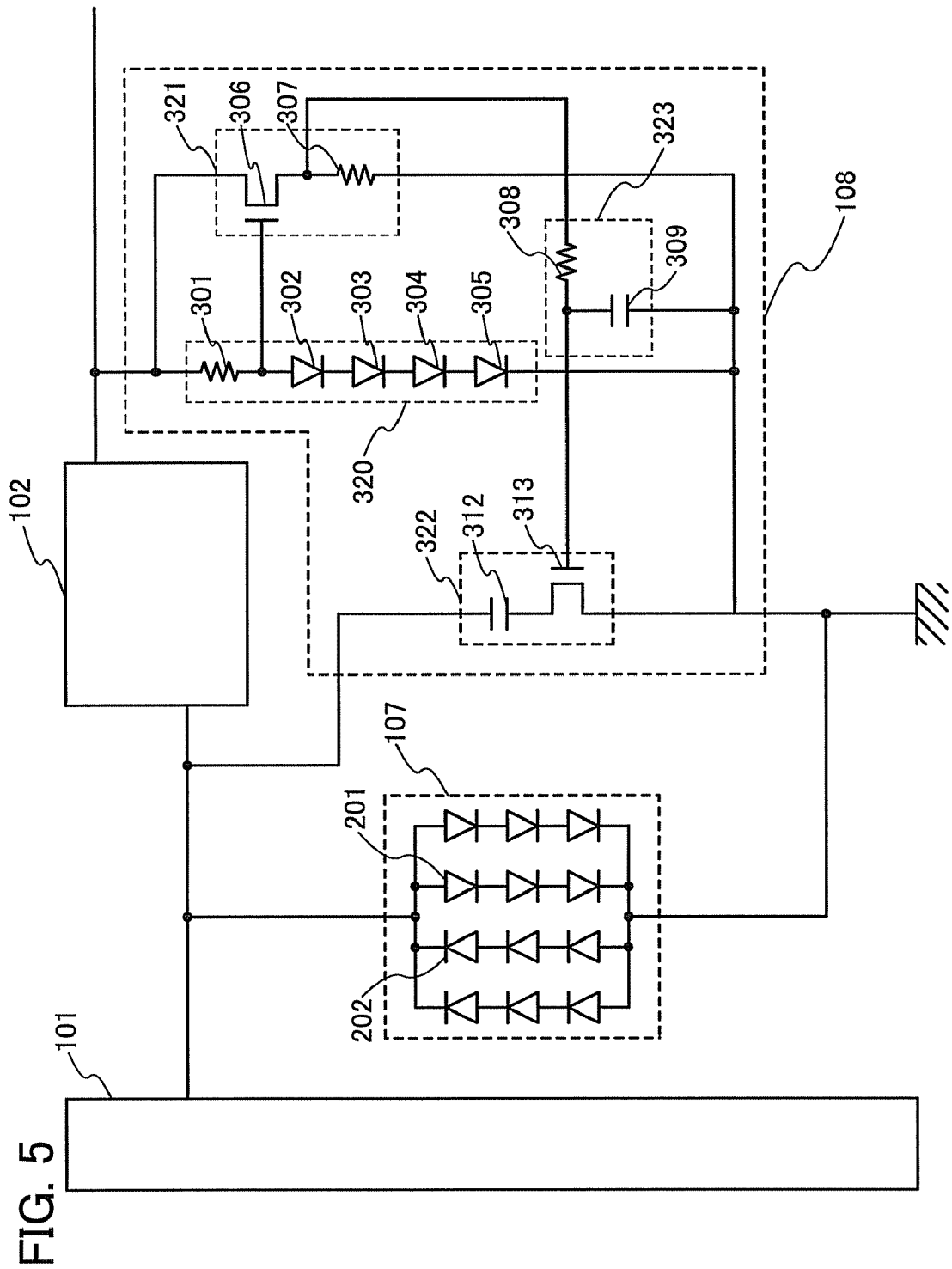
FIG. 5 is a diagram illustrating a structural example of the semiconductor device according to one embodiment of the present invention.

Further, in addition to the structure of the second protection circuit 108 illustrated in FIG. 4, a low pass filter 323 can be provided, as illustrated in FIG. 5. The low pass filter 323 includes a filter resistor 308 and a filter capacitor 309. One of ends of the filter resistor 308 is electrically connected to the other of the source electrode and the drain electrode of the p-channel transistor 306 and the one of the ends of the second resistor 307. The other of the ends of the filter resistor 308 is electrically connected to the gate electrode of the n-channel transistor 313. One of electrodes of the filter capacitor 309 is electrically connected to the gate electrode of the n-channel transistor 313 and the other of the ends of the filter resistor 308, and the other of the electrodes of the filter capacitor 309 is grounded. With the low pass filter 323, the AC voltage generated in the antenna 101 can be prevented from entering as noise of the internal voltage Vin.

By providing the second protection circuit 108 in a semiconductor device having a wireless communication function, a semiconductor device which is normally operated even in the case where a signal having high amplitude is supplied to the semiconductor device and has high reliability can be obtained.

Embodiment 3

A method for manufacturing semiconductor elements included in the first protection circuit and the second protection circuit which are described in Embodiments 1 and 2 is described in this embodiment. Specifically, a method for manufacturing the semiconductor elements over the same substrate by using photolithography is described.

In this embodiment, as the transistors included in the semiconductor devices described in Embodiments 1 and 2, thin film transistors which can be manufactured by using photolithography can be used. The number of gate electrodes of the thin film transistor may be two or more (a multi-gate structure). With a multi-gate structure, the amount of off-state current is reduced and the withstand voltage of the transistor is increased, so that reliability can be improved. Alternatively, a structure where gate electrodes are provided over and below a channel may be used. Alternatively, the structure of the transistor may be any of the following structures: a structure where a gate electrode is provided over a channel, a structure where a gate electrode is provided below a channel, a staggered structure, or an inverted staggered structure. A channel region may be divided into a plurality of regions, or a plurality of channel regions may be connected in parallel or in series. Further, a source electrode or a drain electrode may overlap with a channel region (or part of it). By using a structure where a source electrode or a drain electrode overlaps with a channel region (or part of it), electric charge can be prevented from being accumulated in part of the channel, which would otherwise result in unstable operation. Alternatively, LDD regions may be provided in a source region and a drain region. By providing the LDD regions, the amount of off-state current is reduced and the withstand voltage of the transistor is increased, so that reliability can be improved.

In addition, in this embodiment, PIN diodes are used as the first diode 201 and the second diode 202 in the first protection circuit 107 described in Embodiment 1 (see FIG. 2). In the case where the PIN diodes are manufactured by using photolithography, one of the following two structures may be used.

Figure 6:
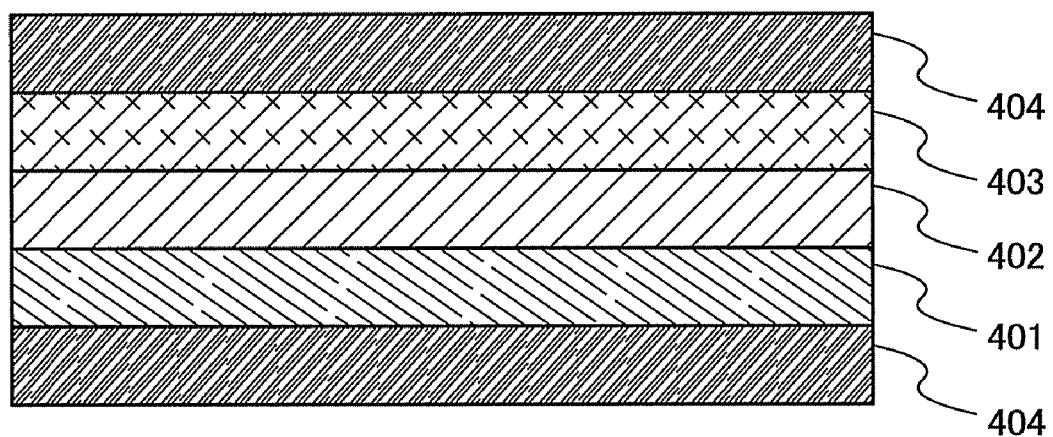
FIG. 6 is a cross-sectional view illustrating an example of a diode which can be used for a first protection circuit according to one embodiment of the present invention.

A PIN diode illustrated in FIG. 6 has a structure where a semiconductor film 401 containing an impurity element which imparts one conductivity type, a semiconductor film 403 containing an impurity element which imparts a conductivity type opposite to the one conductivity type, and a semiconductor film 402 which is interposed between the two semiconductor films are stacked. In addition, wirings 404 are formed outside the semiconductor film 401 containing an impurity element which imparts one conductivity type and the semiconductor film 403 containing an impurity element which imparts a conductivity type opposite to the one conductivity type. This PIN diode is manufactured by sequentially stacking and depositing the semiconductor films.

Figure 7:
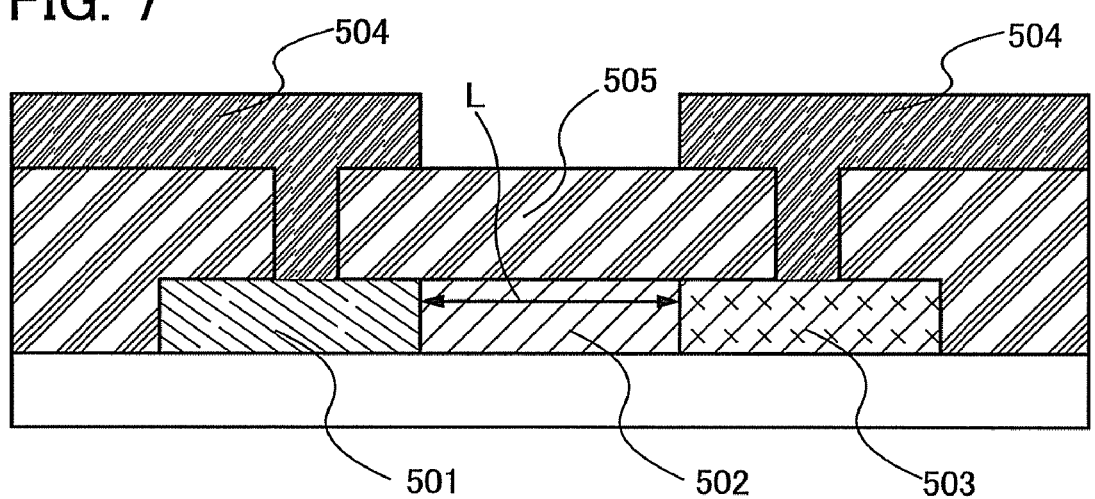
FIG. 7 is a cross-sectional view illustrating an example of a diode which can be used for the first protection circuit according to one embodiment of the present invention.

A PIN diode illustrated in FIG. 7 has a structure where a first semiconductor region 501 containing an impurity element which imparts one conductivity type, a second semiconductor region 503 containing an impurity element which imparts a conductivity type opposite to the one conductivity type, and a third semiconductor region 502 which is interposed between the first semiconductor region 501 and the second semiconductor region 503 and has a larger resistance value than the first semiconductor region 501 and the second semiconductor region 503 are formed on the same plane. In addition, wirings 504 in contact holes provided in an insulating film 505 are formed in the first semiconductor region 501 and the second semiconductor region 503. This PIN diode is manufactured by selective implantation of an impurity element which imparts p-type conductivity and an impurity element which imparts n-type conductivity to a semiconductor film.

Both the PIN diodes having the structures illustrated in FIG. 6 and FIG. 7 can be used as the first diode and the second diode which are described in Embodiment 1. Note that in forming diodes and thin film transistors over the same substrate, the PIN diode having the latter structure is preferable. In addition, in the PIN diode having the latter structure, the length L of the third semiconductor region 502 can be controlled in a step of selective implantation of impurity elements. Thus, it is easy to increase the length L of the third semiconductor region 502 so that withstand voltage can be increased. Therefore, the PIN diode having the latter structure is preferable as the first diode and the second diode which need high withstand voltage.

In addition, in this embodiment, diode-connected transistors are used as the voltage divider diodes 302, 303, 304, and 305 in the second protection circuit 108 described in Embodiment 2 (see FIG. 4). Since a channel is formed when the diode-connected transistor is on, it is not necessary to increase the area of the diode in order to improve current drive capability. Thus, increase in circuit area can be minimized, so that the diode-connected transistor is preferable as the voltage divider diode.

In addition, by forming circuits over the same substrate, the number of components can be reduced so that cost is reduced, and the number of connections to other circuit components can be reduced so that reliability is improved. Alternatively, some of the circuits may be formed over a substrate and the other parts of the circuits may be formed over a different substrate. That is, not all the circuits are required to be formed over the same substrate. For example, some of the circuits may be formed using transistors over a glass substrate, and the other parts of the circuits may be formed using a single crystal substrate, and the IC chip may be connected to the glass substrate by COG (chip on glass) so as to be provided over the glass substrate. Alternatively, the IC chip may be connected to the glass substrate by TAB (tape automated bonding) or a printed wiring board. By forming some of the circuits over the same substrate in this manner, the number of components can be reduced so that cost is reduced, and the number of connections between the circuits and the components can be reduced so that reliability is improved. In addition, by forming a portion with high drive voltage or a portion with high drive frequency by using a different substrate, increase in power consumption can be prevented.

A method for manufacturing PIN diodes which can be used as the first diode 201 and the second diode 202 in the first protection circuit 107 described in Embodiment 1; and a p-channel thin film transistor which can be used as the p-channel transistor 306, diode-connected n-channel thin film transistors which can be used as the voltage divider diodes 302, 303, 304, and 305, a multi-gate n-channel thin film transistor which can be used as the n-channel transistor 313, and a capacitor which can be used as the capacitor 312 in the second protection circuit 108 described in Embodiment 2 over the same substrate, is illustrated with reference to FIGS. 8A to 8D and FIGS. 9A and 9B.

Figure 8A:
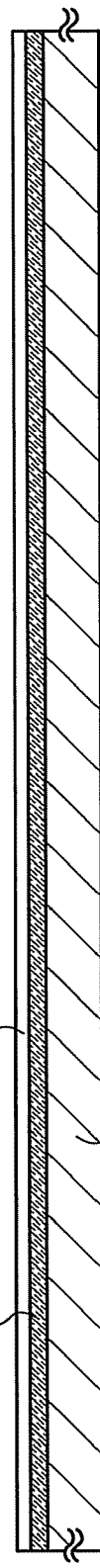
FIGS. 8A to 8D are cross-sectional views illustrating examples of manufacturing steps of a semiconductor device according to one embodiment of the present invention.
Figure 8B:
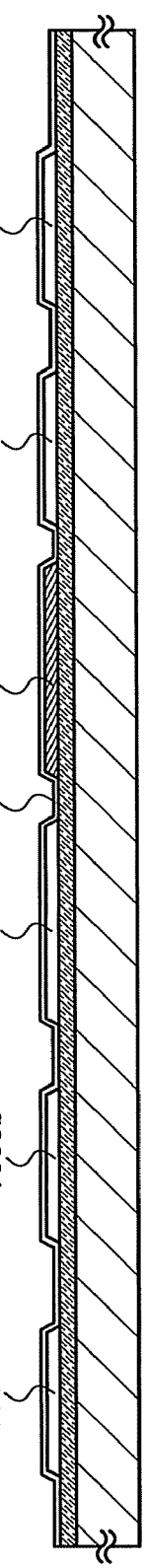
Figure 8C:
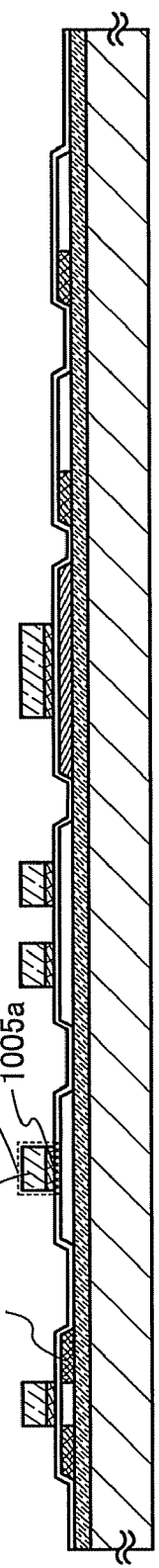
Figure 8D:
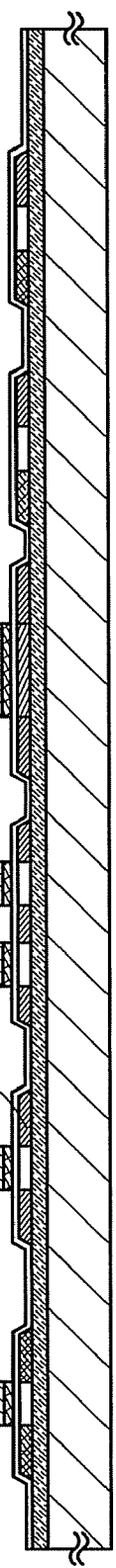
Figure 10:
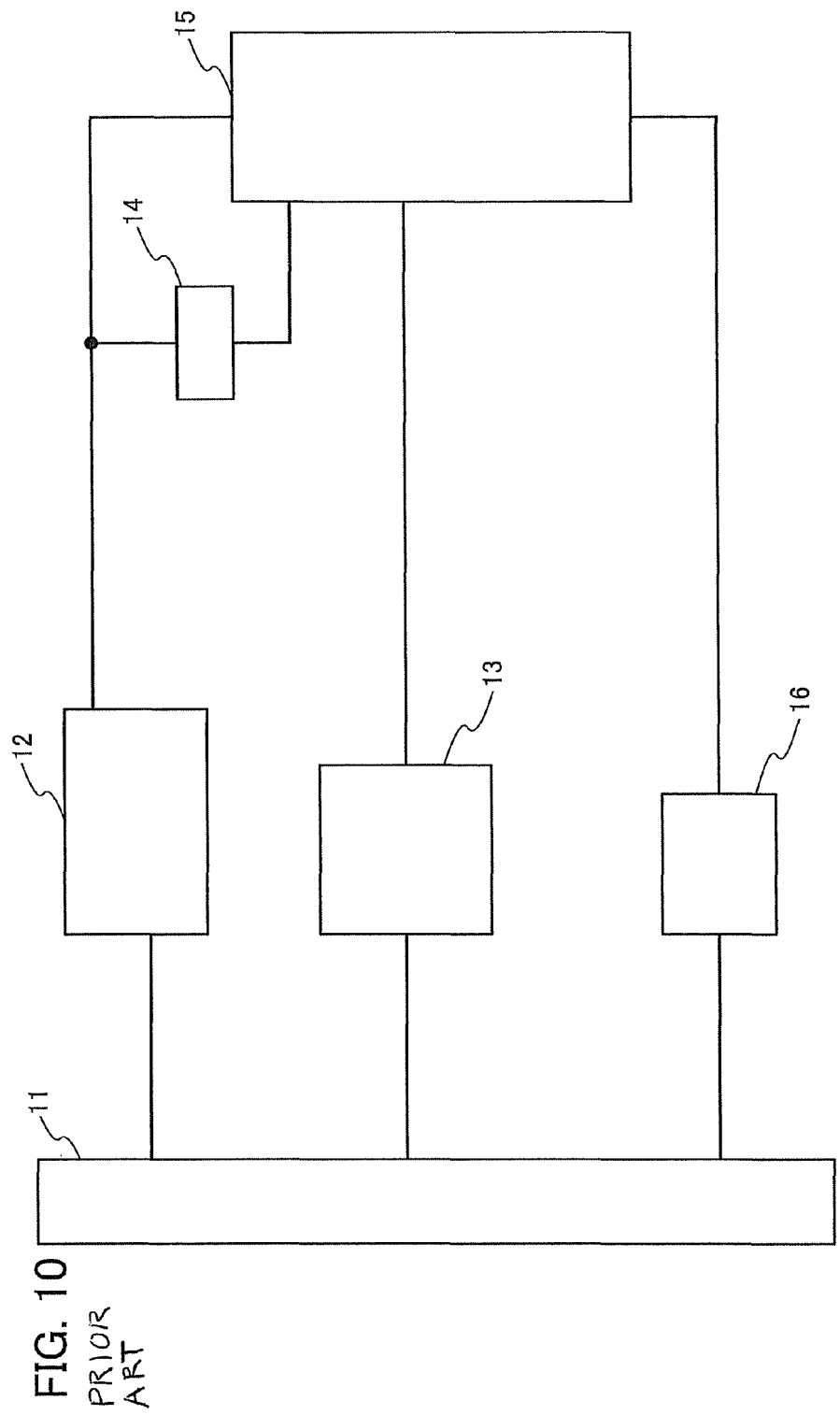
FIG. 10 is a block diagram illustrating a structural example of a conventional semiconductor device having a wireless communication function.

First, an insulating film 1002 which serves as a base film and an amorphous semiconductor film 1003 (e.g., a film containing amorphous silicon) are stacked over a surface of a substrate 1001 (see FIG. 8A). Note that the insulating film 1002 and the amorphous semiconductor film 1003 can be formed successively.

The substrate 1001 is selected from a glass substrate, a quartz substrate, a metal substrate such as a stainless steel substrate, a ceramic substrate, a semiconductor substrate such as a silicon substrate, an SOI (silicon on insulator) substrate, or the like. Alternatively, as a plastic substrate, a substrate formed using polyethylene terephthalate (PET), polyethylene naphthalate (PEN), polyether sulfone (PES), acrylic, or the like can be selected.

The insulating film 1002 is formed using an insulating material such as silicon oxide ($SiO_x$), silicon nitride ($SiN_x$), silicon oxynitride ($SiO_xN_y$), (x>y>0), or silicon nitride oxide ($SiN_xO_y$) (x>y>0) by CVD, sputtering, or the like. For example, in the case where the insulating film 1002 has a two-layer structure, a silicon nitride oxide film may be formed as a first insulating film and a silicon oxynitride film may be formed as a second insulating film. Alternatively, a silicon nitride film may be formed as the first insulating film and a silicon oxide film may be formed as the second insulating film. The insulating film 1002 functions as a blocking layer which prevents an impurity element from being mixed into an element formed over the substrate 1001 from the substrate 1001. By forming the insulating film 1002 which functions as a blocking layer in this manner, an alkali metal such as sodium or an alkaline earth metal from the substrate 1001 can be prevented from adversely affecting the element formed over the substrate 1001. Note that in the case where quartz is used for the substrate 1001, for example, the insulating film 1002 may be omitted.

The amorphous semiconductor film 1003 is formed to a thickness of 25 to 200 nm (preferably 30 to 150 nm) by sputtering, LPCVD, plasma-enhanced CVD, or the like.

Next, the amorphous semiconductor film 1003 is crystallized by laser irradiation. Note that the amorphous semiconductor film 1003 may be crystallized by a method in which laser irradiation is combined with thermal crystallization using RTA or an annealing furnace, or thermal crystallization using a metal element which promotes crystallization, or the like. After that, a crystalline semiconductor film which is obtained is etched to have a desired shape so that crystalline semiconductor films 1003a to 1003f are formed, and a gate insulating film 1004 is formed over the substrate 1001 and the crystalline semiconductor films 1003a to 1003f. Note that since the crystalline semiconductor film 1003d is used as an electrode of the capacitor, an impurity element is introduced into the crystalline semiconductor film 1003d (see FIG. 8B).

The gate insulating film 1004 is formed using an insulating material such as silicon oxide, silicon nitride, silicon oxynitride, or silicon nitride oxide by CVD, sputtering, or the like. For example, in the case where the gate insulating film 1004 has a two-layer structure, a silicon oxynitride film may be formed as a first insulating film and a silicon nitride oxide film may be formed as a second insulating film. Alternatively, a silicon oxide film may be formed as the first insulating film and a silicon nitride film may be fixated as the second insulating film.

An example of a manufacturing step of the crystalline semiconductor films 1003a to 1003f is briefly described below. First, the amorphous semiconductor film 1003 is formed to a thickness of 50 to 60 nm by plasma-enhanced CVD. Next, a solution containing nickel, which is a metal element for promoting crystallization, is retained on the amorphous semiconductor film 1003, and then dehydrogenation treatment (at 500° C. for 1 hour) and thermal crystallization treatment (at 550° C. for 4 hours) are performed on the amorphous semiconductor film 1003 so that crystalline semiconductor films are formed. After that, with laser irradiation and photolithography, the crystalline semiconductor films 1003a to 1003f are formed. Note that the amorphous semiconductor film 1003 may be crystallized only by laser irradiation without thermal crystallization using a metal element which promotes crystallization.

As a laser used for crystallization, a continuous wave laser beam (a CW laser beam) or a pulsed laser beam can be used. As a laser beam which can be used here, a laser beam emitted from one or plural kinds of a gas laser such as an Ar laser, a Kr laser, or an excimer laser; a laser whose medium is single crystal YAG; $YVO_4$, forsterite ($Mg_2SiO_4$), $YAlO_3$, $GdVO_4$, or polycrystalline (ceramic) YAG; $Y_2O_3$, $YVO_4$, $YAlO_3$, or $GdVO_4$ to which one or more of Nd, Yb, Cr, Ti, Ho, Er, Tm, and Ta are added as a dopant; a glass laser; a ruby laser; an alexandrite laser; a Ti: sapphire laser; a copper vapor laser; and a gold vapor laser can be used. By laser irradiation with a fundamental wave of such a laser beam and a second harmonic wave to a fourth harmonic wave of the fundamental wave of such a laser beam, crystals each having a large grain size can be obtained. For example, the second harmonic (532 nm) or the third harmonic (355 nm) of an Nd:$YVO_4$ laser (a fundamental wave of 1064 nm) can be used. In this case, a power density of approximately 0.01 to 100 $MW/cm^2$ (preferably 0.1 to 10 $MW/cm^2$) is necessary for the laser. In addition, irradiation is performed at a scanning rate of approximately 10 to 2000 cm/sec. Note that a laser whose medium is single crystal YAG, $YVO_4$, forsterite ($Mg_2SiO_4$), $YAlO_3$, or $GdVO_4$, or polycrystalline (ceramic) YAG, $Y_2O_3$, $YVO_4$, $YAlO_3$, or $GdVO_4$ to which one or more kinds of Nd, Yb, Cr, Ti, Ho, Er, Tm and Ta are added as a dopant; an Ar ion laser; or a Ti: sapphire laser can be continuously oscillated. Furthermore, pulse oscillation can be performed at a repetition rate of 10 MHz or higher by Q-switch operation, mode locking, or the like. When a laser beam is oscillated at a repetition rate of 10 MHz or higher, a semiconductor film is irradiated with the next pulse during a period in which the semiconductor film is melted by the laser beam and then is solidified. Therefore, unlike in the case of using a pulsed laser with a low repetition rate, a solid-liquid interface can be continuously moved in the semiconductor film, so that crystal grains, which continuously grow toward a scanning direction, can be obtained.

Alternatively, the gate insulating film 1004 may be formed by high-density plasma treatment on the crystalline semiconductor films 1003a to 1003f so that surfaces thereof are oxidized or nitrided. Plasma treatment is performed, for example, using a mixed gas of a rare gas such as helium, argon, krypton, or xenon, and a gas such as oxygen, nitrogen oxide, ammonia, nitrogen, or hydrogen. When excitation of plasma in this case is performed by introduction of a microwave, plasma with a low electron temperature and high density can be generated. By oxygen radical (which might include OH radical) or nitrogen radical (which might include NH radical) generated by high density plasma, the surfaces of the semiconductor films can be oxidized or nitrided.

By treatment using such high-density plasma, an insulating film with a thickness of 1 to 20 nm, typically 5 to 10 nm, is formed over the semiconductor film. Since the reaction in this case is solid-phase reaction, interface state density between the insulating film and the semiconductor film can be made extremely low. Since such high-density plasma treatment directly oxidizes (or nitrides) a semiconductor film (formed using crystalline silicon or polycrystalline silicon), variation in thickness of the insulating film to be formed can be significantly reduced, ideally. In addition, oxidation is not strengthened even at a crystal grain boundary of crystalline silicon, which leads to an extremely preferable condition. That is, by performing solid phase oxidization on a surface of the semiconductor film by the high-density plasma treatment described here, an insulating film with favorable uniformity and low interface state density can be formed without abnormal oxidation reaction at a crystal grain boundary.

As the gate insulating film 1004, only an insulating film formed by high-density plasma treatment may be used, or an insulating film formed using silicon oxide, silicon oxynitride, silicon nitride, or the like may be deposited to be stacked thereover by CVD using plasma or thermal reaction. In any case, in a transistor which is formed so that the insulating film formed by high-density plasma treatment is included in part or all of the gate insulating film, variation in characteristics can be reduced.

Further, in the crystalline semiconductor films 1003a to 1003f which are obtained by crystallizing the amorphous semiconductor film 1003 by irradiation with a continuous wave laser beam or a laser beam oscillated at a repetition rate of 10 MHz or higher and is scanned in one direction, crystals grow in the scanning direction of the beam. A transistor is arranged by adjusting the scanning direction to a channel length direction (a direction in which carriers flow when a channel formation region is formed) and the gate insulating film is combined. Thus, a thin film transistor (TFT) with little variation in characteristics and high field effect mobility can be obtained.

Before or after the formation of the gate insulating film 1004, the crystalline semiconductor films 1003a, 1003b, 1003c, 1003d, and 1003f are covered with a resist, and an impurity element which imparts n-type conductivity or p-type conductivity is selectively introduced into the crystalline semiconductor film 1003d which is used as the electrode of the capacitor by ion doping or ion implantation. As the impurity element which imparts n-type conductivity, phosphorus (P), arsenic (As), or the like can be used. As the impurity element which imparts p-type conductivity, boron (B), aluminum (Al), gallium (Ga), or the like can be used. In this embodiment, phosphorus (P) is used as the impurity element which imparts n-type conductivity and is selectively introduced into the crystalline semiconductor film 1003d.

Next, a first conductive film and a second conductive film are stacked over the gate insulating film 1004. Here, the first conductive film is formed to a thickness of 20 to 100 nm by CVD, sputtering or the like. The second conductive film is formed to a thickness of 100 to 400 nm. The first conductive film and the second conductive film are formed using an element selected from tantalum (Ta), tungsten (W), titanium (Ti), molybdenum (Mo), aluminum (Al), copper (Cu), chromium (Cr), niobium (Nb), or the like, or an alloy material or a compound material containing the above element as its main component. Alternatively, the first conductive film and the second conductive film are formed using a semiconductor material typified by polycrystalline silicon doped with an impurity element such as phosphorus. As examples of a combination of the first conductive film and the second conductive film, a tantalum nitride film and a tungsten film, a tungsten nitride film and a tungsten film, a molybdenum nitride film and a molybdenum film, and the like can be given. Since tungsten and tantalum nitride have high heat resistance, heat treatment for thermal activation can be performed after the first conductive film and the second conductive film are formed. In addition, in the case of a three-layer structure instead of a two-layer structure, a layered structure of a molybdenum film, an aluminum film, and a molybdenum film is preferably employed.

Next, gate electrodes 1005 are formed above the crystalline semiconductor films 1003a to 1003d by etching with a resist selectively formed using photolithography used as a mask. In this embodiment, an example is described in which the gate electrode 1005 has a layered structure of a first conductive film 1005a and a second conductive film 1005b. Note that since a multi-gate n-channel thin film transistor is formed using the crystalline semiconductor film 1003c, two gate electrodes are formed over the crystalline semiconductor film 1003c. Further, since a PIN diode is formed using the crystalline semiconductor films 1003e and 1003f, gate electrodes are not formed over the crystalline semiconductor films 1003e and 1003f.

Next, an impurity element which imparts p-type conductivity is added by ion doping or ion implantation with resists selectively formed using photolithography and the gate electrodes 1005 used as masks. As the impurity element which imparts p-type conductivity, boron (B), aluminum (Al), gallium (Ga), or the like can be used. In this embodiment, resists are formed over the crystalline semiconductor films 1003b, 1003c, and 1003d, part of the crystalline semiconductor film 1003e, and part of the crystalline semiconductor film 1003f, and boron (B) is used as the impurity element which imparts p-type conductivity and is selectively introduced into the crystalline semiconductor films 1003a, 1003e, and 1003f so as to be contained at a concentration of $1\times10^{19}$ to $1\times10^{20}$ atoms/cm$^3$. Thus, semiconductor regions 1006 containing the impurity element which imparts p-type conductivity are formed (see FIG. 8C).

Next, an impurity element which imparts n-type conductivity is added by ion doping or ion implantation with resists selectively formed using photolithography and the gate electrodes 1005 used as masks. As the impurity element which imparts n-type conductivity, phosphorus (P), arsenic (As), or the like can be used. In this embodiment, resists are formed over the crystalline semiconductor film 1003a, part of the crystalline semiconductor film 1003e, and part of the crystalline semiconductor film 1003f, and phosphorus (P) is used as the impurity element which imparts n-type conductivity and is selectively introduced into the crystalline semiconductor films 1003b, 1003c, 1003d, 1003e, and 1003f so as to be contained at a concentration of $1\times10^{19}$ to $1\times10^{20}$ atoms/cm$^3$. Thus, semiconductor regions 1007 containing the impurity element which imparts n-type conductivity are formed (see FIG. 8D).

Next, an insulating film 1008 having a single-layer structure or a layered structure is formed over the gate insulating film 1004 and the gate electrodes 1005. Contact holes are selectively formed in the insulating film 1008, and a conductive film which is connected to the gate electrodes formed over the impurity regions containing the impurity element which imparts n-type conductivity, the impurity regions containing the impurity element which imparts p-type conductivity, and the crystalline semiconductor film 1003d which is used as the electrode of the capacitor is formed. The conductive film is etched using a resist fowled by photolithography as a mask so that wirings 1009 are formed (see FIG. 9A).

The insulating film 1008 is formed to have a single-layer structure or a layered structure of an inorganic material such as an oxide of silicon or a nitride of silicon, an organic material such as polyimide, polyamide, benzocyclobutene, acrylic, or epoxy, a siloxane material, or the like, by CVD, sputtering, an SOG method, a droplet discharge method, a screen printing method, or the like. In this embodiment, the insulating film 1008 is formed to have a two-layer structure. A silicon nitride oxide film is formed as a first insulating film 1008a and a silicon oxynitride film is formed as a second insulating film 1008b. Note that a siloxane material corresponds to a material including a Si—O—Si bond. Siloxane has a skeleton structure by the bond of silicon (Si) and oxygen (O). An organic group (e.g., an alkyl group or aromatic hydrocarbon) or a fluoro group may be used as a substituent. A fluoro group may be contained in the organic group.

Note that before the insulating films 1008a and 1008b are formed or after one or both thin films of the insulating films 1008a and 1008b are formed, heat treatment for recovering the crystallinity of the crystalline semiconductor films 1003a to 1003f, for activating the impurity elements added to the crystalline semiconductor films 1003a to 1003f, or for hydrogenating the crystalline semiconductor films 1003a to 1003f may be performed. For the heat treatment, thermal annealing, laser annealing, RTA, or the like may be used.

The wirings 1009 are formed to have a single-layer structure or a layered structure of an element selected from aluminum (Al), tungsten (W), titanium (Ti), tantalum (Ta), molybdenum (Mo), nickel (Ni), platinum (Pt), copper (Cu), gold (Au), silver (Ag), manganese (Mn), neodymium (Nd), carbon (C), or silicon (Si), or an alloy material or a compound material containing the above element as its main component by CVD, sputtering, or the like. For example, an alloy material containing aluminum as its main component corresponds to, for example, a material containing aluminum as its main component and containing nickel, or an alloy material containing aluminum as its main component and containing nickel and one or both carbon and silicon. For example, the wirings 1009 may be formed to have a layered structure of a barrier film, an aluminum-silicon film, and a barrier film or a layered structure of a barrier film, an aluminum-silicon film, a titanium nitride film, and a barrier film. Since aluminum and aluminum silicon have small resistance values and are inexpensive, they are suitable for materials for forming the wirings 1009. Note that the barrier film corresponds to a thin film formed using titanium, a nitride of titanium, molybdenum, or a nitride of molybdenum. When barrier layers are provided for a top layer and a bottom layer, hillocks of aluminum or aluminum silicon can be prevented from being generated. Further, when the barrier film is formed using titanium, which is highly reducible, even when thin native oxide is formed over the crystalline semiconductor films 1003$a$ to 1003$f$, this native oxide can be reduced and a favorable contact with the crystalline semiconductor films 1003$a$ to 1003$f$ can be obtained.

Next, an insulating film 1010 is formed over the insulating film 1008 and the wirings 1009. Subsequently, a contact hole is formed in the insulating film 1010. Note that the contact hole is formed so that a wiring electrically connected to the impurity region containing the impurity element which imparts n-type conductivity in the crystalline semiconductor film 1003$e$ and a wiring electrically connected to the impurity region containing the impurity element which imparts p-type conductivity in the crystalline semiconductor film 1003$f$ are exposed. Subsequently, a conductive film is formed. After that, the conductive film is etched so that a wiring 1011 is formed. The wiring 1011 can be formed using any of the materials for the wirings 1009.

Subsequently, a conductive film 1012 which functions as an antenna 1013 is formed so as to be electrically connected to the wiring 1011 (see FIG. 9B).

Note that the insulating film 1010 can be formed to have a single-layer structure or a layered structure of an insulating film containing oxygen and/or nitrogen, such as silicon oxide, silicon nitride, silicon oxynitride, or silicon nitride oxide; a film containing carbon such as DLC (diamond-like carbon); an organic material such as epoxy, polyimide, polyamide, polyvinyl phenol, benzocyclobutene, or acrylic; or a siloxane material such as a siloxane resin by CVD, sputtering, or the like.

The conductive film 1012 is formed using a conductive material by CVD, sputtering, a printing method such as a screen printing method or a gravure printing method, a droplet discharge method, a dispenser method, a plating method, or the like. The conductive film 1012 is formed to have a single-layer structure or a layered structure of an element selected from aluminum (Al), titanium (Ti), silver (Ag), copper (Cu), gold (Au), platinum (Pt), nickel (Ni), palladium (Pd), tantalum (Ta), or molybdenum (Mo), or an alloy material or a compound material containing the above element as its main component.

For example, in the case where the conductive film 1012 which functions as the antenna 1013 is formed by a screen printing method, the conductive film 1012 can be formed by selectively printing a conductive paste in which conductive particles with a grain diameter of several nanometers to several tens of micrometers are dissolved or dispersed in an organic resin. As the conductive particles, one or more of metal particles of silver (Ag), gold (Au), copper (Cu), nickel (Ni), platinum (Pt), palladium (Pd), tantalum (Ta), molybdenum (Mo), titanium (Ti), and the like; fine particles of silver halide; or dispersive nanoparticles can be used. In addition, as the organic resin included in the conductive paste, one or more selected from organic resins which function as a binder of metal particles, a solvent, a dispersive agent and a coating material can be used. Typically, an organic resin such as an epoxy resin or a silicone resin can be used. Further, in forming the conductive film 1012, baking is preferably performed after the conductive paste is formed. For example, in the case where fine particles containing silver as a main component (e.g., particles with a grain diameter greater than or equal to 1 nm and less than or equal to 100 nm) as a material of the conductive paste, the conductive film 1012 can be obtained by curing the conductive paste by baking at temperatures in the range of 150 to 300° C. Alternatively, fine particles containing solder or lead-free solder as a main constituent may be used. In this case, fine particles with a grain diameter of 20 μm or less is preferably used. Solder and lead-free solder have advantages such as low cost.

Further, in this embodiment, the antenna 1013 including the conductive film 1012 is formed directly on the insulating film 1010 by etching to have a desired shape after deposition or by screen printing; however, the method for forming the antenna 1013 is not limited to this method. The antenna 1013 may be separately formed over the above substrate, a flexible plastic substrate, or the like and may be in contact and attached so as to be electrically connected onto the wiring 1011.

As described above, a PIN diode 1026 which can be used as the first diode 201 and a PIN diode 1025 which can be used as the second diode 202 in the first protection circuit 107 described in Embodiment 1; and a p-channel thin film transistor 1021 which can be used as the p-channel transistor 306, an n-channel thin film transistor 1022 which can be used as the voltage divider diodes 302, 303, 304, and 305, a multi-gate n-channel thin film transistor 1023 which can be used as the n-channel transistor 313, and a capacitor 1024 which can be used as the capacitor 312 in the second protection circuit 108 described in Embodiment 2, can be formed over the same substrate.

Embodiment 4

In this embodiment, usage examples of the semiconductor devices of the above embodiments are described.

The semiconductor devices are widely used. Usage examples of the semiconductor devices are described with reference to FIGS. 11A to 11F. FIGS. 11A to 11F are schematic views illustrating usage examples of the semiconductor devices.

Figure 11A:
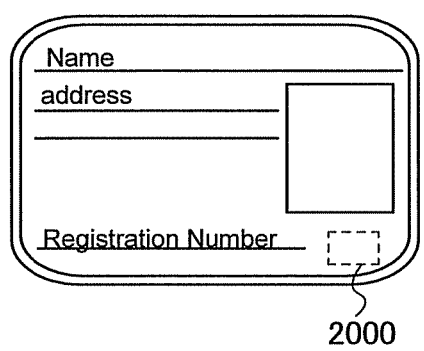
FIGS. 11A to 11F are schematic views illustrating usage examples of a semiconductor device according to one embodiment of the present invention.
Figure 11B:
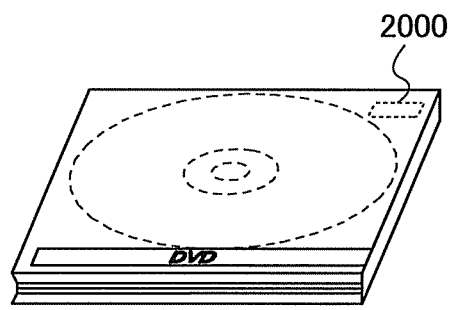
Figure 11C:
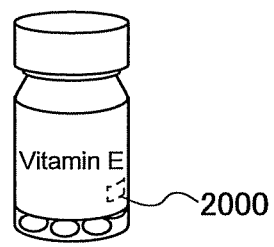
Figure 11D:
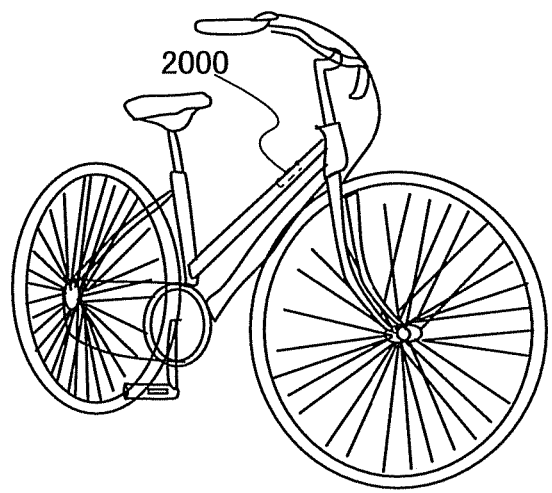
Figure 11E:
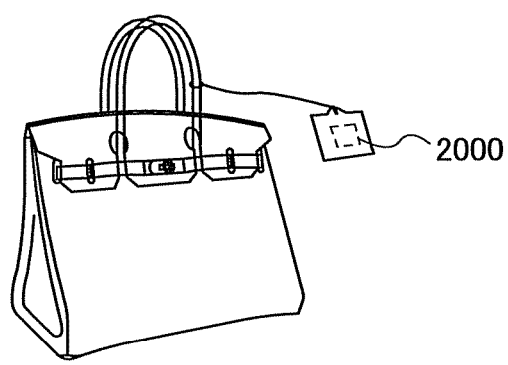
Figure 11F:
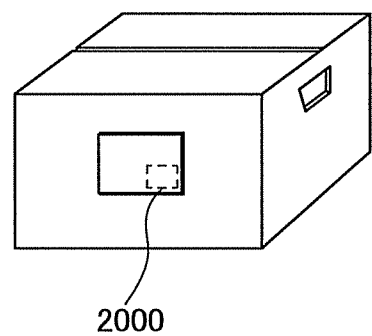

As illustrated in FIGS. 11A to 11F, the semiconductor device can be used widely and can be used by being provided for, for example, bills, coins, securities, bearer bonds, certificates (e.g., driver's licenses or resident cards, see FIG. 11A), recording media (e.g., DVDs or video tapes, see FIG. 11B), containers for wrapping objects (e.g., wrapping paper or bottles, see FIG. 11C), vehicles (e.g., bicycles, see FIG. 11D), personal belongings (e.g., bags or glasses), foods, plants, animals, human bodies, clothes, commodities, or electronic devices (e.g., liquid crystal display devices, EL display devices, television sets, or mobile phones), or shipping tags of objects (see FIGS. 11E and 11F).

A semiconductor device 2000 is fixed to an object by being mounted on a printed wiring board, attached to a surface, or embedded therein. For example, the semiconductor device 2000 is fixed to an object by being embedded in paper of a book or an organic resin of a package. Since the semiconductor device 2000 achieves reduction in size, thickness, and weight, the attractive design of the object itself is not spoiled even after the semiconductor device is fixed to the object. In addition, when the semiconductor device 2000 is provided for bills, coins, securities, bearer bonds, certificates, or the like, an authentication function can be provided, and forgery thereof can be prevented by utilizing the authentication function. Further, when the semiconductor device is attached to containers for wrapping objects, recording media, personal belongings, foods, clothes, commodities, electronic devices, or the like, a system such as an inspection system can be efficiently used. Furthermore, even vehicles can have higher safety against theft or the like when the semiconductor device 2000 is attached to the vehicles.

Since the semiconductor devices of the above embodiments have high reliability as described above, data which is used for exchanging information can be maintained at an accurate value. Therefore, the semiconductor devices can also be used for purposes which need high reliability, for example, authenticity or security of an object.

Example 1

Figure 12:
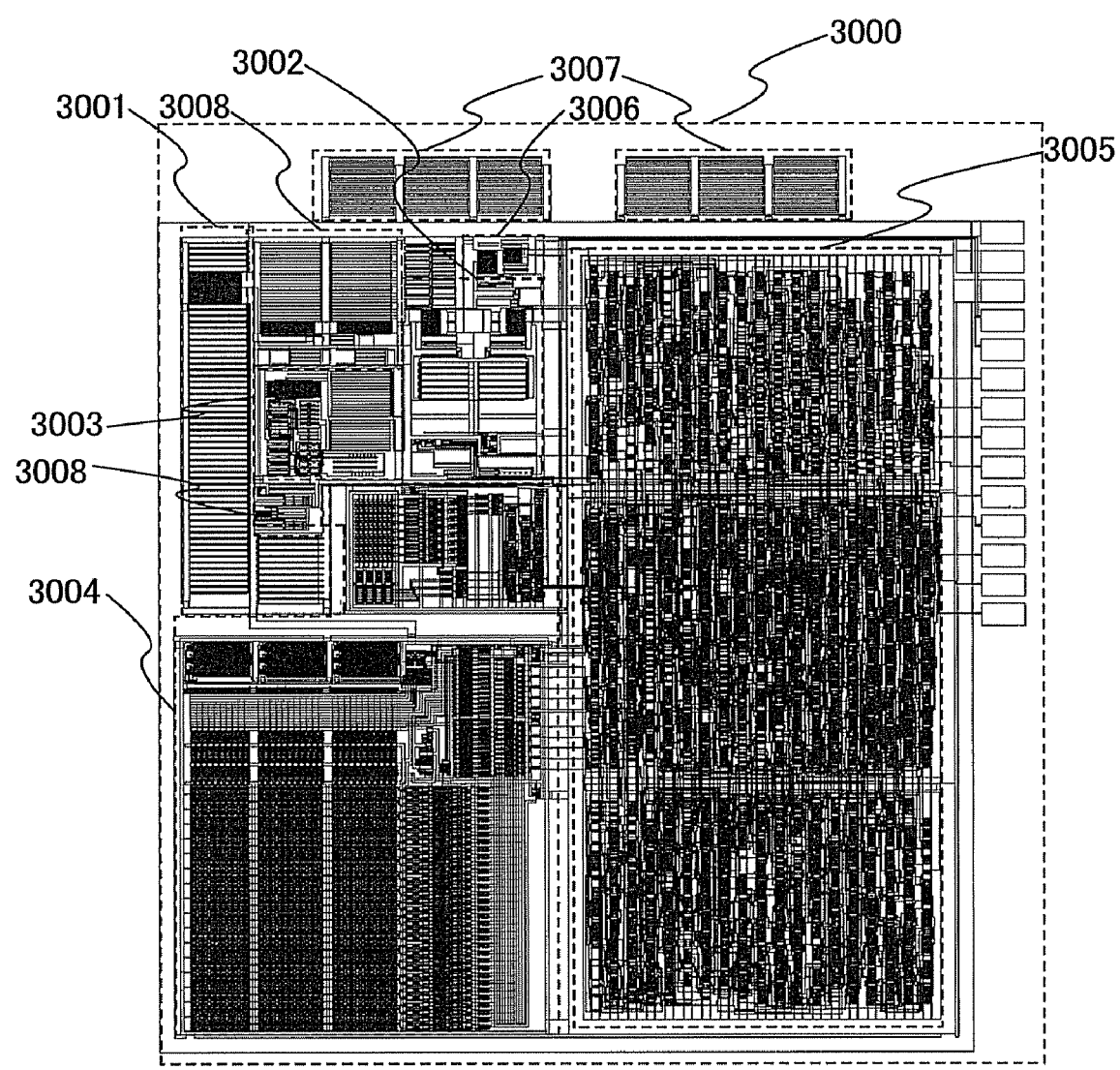
FIG. 12 is a diagram illustrating an example of layout of a semiconductor device according to one embodiment of the present invention.

In this example, a semiconductor device including the first protection circuit and the second protection circuit of the above embodiments is described with reference to FIG. 12.

A semiconductor device 3000 includes a rectifier circuit 3001 for converting AC voltage generated in an antenna into DC voltage, a demodulation circuit 3002 for demodulating the AC voltage generated in the antenna into a digital signal, a constant voltage circuit 3003 for applying stable voltage to an internal circuit, a memory circuit 3004, a logic circuit 3005, a modulation circuit 3006 for modulating encoded data, a first protection circuit 3007, and a second protection circuit 3008. Note that since the antenna is stacked over the semiconductor device 3000, the antenna is not illustrated in FIG. 12. In addition, the antenna can be formed separately from a chip including the rectifier circuit 3001, the demodulation circuit 3002, the constant voltage circuit 3003, the memory circuit 3004, the logic circuit 3005, the modulation circuit 3006, the first protection circuit 3007, and the second protection circuit 3008 and can be connected to the semiconductor device 3000 in a different step; however, the antenna and the chip itself are preferably formed in the same step.

The logic circuit 3005 includes an instruction analysis circuit for analyzing data demodulated in the demodulation circuit 3002, a determination circuit for determining whether the demodulated data can be received accurately, a controller circuit for controlling the memory circuit 3004, and an encoding circuit for encoding data. In the logic circuit 3005 of this example illustrated in FIG. 12, the above circuits are arranged.

In this example, a signal encoded in the encoding circuit of the logic circuit 3005 is input to the modulation circuit 3006, and the modulation circuit 3006 performs load modulation.

The demodulation circuit 3002 demodulates AC voltage applied from the antenna. An output terminal of the demodulation circuit 3002 is connected to the logic circuit 3005. The internal voltage Vin smoothed in the rectifier circuit 3001 is applied to the constant voltage circuit 3003, and the constant voltage circuit 3006 outputs the power supply voltage Vdd generated from the internal voltage Vin to the controller circuit of the logic circuit 3005.

The semiconductor device of this example includes the first protection circuit having a function of preventing application of overvoltage to the circuit such as the rectifier circuit and the second protection circuit which can decrease the number of input signals. Therefore, the semiconductor device of this example is a semiconductor device which is normally operated even in the case where the semiconductor device receives a signal from the outside in an extremely short distance or the semiconductor device receives unwanted radiation emitted from an external electronic device and a signal having high power is supplied to the circuits and which has high reliability.

This application is based on Japanese Patent Application serial no. 2008-258208 filed with Japan Patent Office on Oct. 3, 2008, the entire contents of which are hereby incorporated by reference.

The invention claimed is:

1. A semiconductor device comprising:
an antenna;
a rectifier circuit electrically connected to the antenna;
a first protection circuit; and
a second protection circuit,
wherein a first terminal of the first protection circuit is electrically connected to the antenna, and a second terminal of the first protection circuit is grounded,
wherein a first terminal of the second protection circuit is electrically connected to an output terminal of the rectifier circuit, a second terminal of the second protection circuit is electrically connected to the antenna, and a third terminal of the second protection circuit is grounded,
wherein the first protection circuit includes a first diode and a second diode,
wherein the second protection circuit includes a capacitor and a transistor,
wherein an anode of the first diode is electrically connected to the antenna, and a cathode of the first diode is grounded,
wherein a cathode of the second diode is electrically connected to the antenna, an anode of the second diode is grounded, and the second diode is connected in parallel with the first diode,
wherein one of electrodes of the capacitor is electrically connected to the antenna,
wherein a gate electrode of the transistor is electrically connected to the output terminal of the rectifier circuit,
wherein one of a source electrode and a drain electrode of the transistor is electrically connected to the other of the electrodes of the capacitor, and
wherein the other of the source electrode and the drain electrode of the transistor is grounded.

2. The semiconductor device according to claim 1,
wherein the second protection circuit includes a filter resistor and a filter capacitor,
wherein one of the ends of the filter resistor is electrically connected to the output terminal of the rectifier circuit, and the other of the ends of the filter resistor is electrically connected to the gate electrode of the transistor, and wherein one of electrodes of the filter capacitor is electrically connected to the gate electrode of the transistor and the other of the ends of the filter resistor, and the other of the electrodes of the filter capacitor is grounded.

3. The semiconductor device according to claim 1,
wherein each of the first diode and the second diode is a PIN diode,
wherein the PIN diode includes a first semiconductor region, a second semiconductor region, and a third semiconductor region on the same plane,
wherein the first semiconductor region contains an impurity element which imparts one conductivity type,
wherein the second semiconductor region contains an impurity element which imparts a conductivity type opposite to that of the impurity element, and
wherein the third semiconductor region is interposed between the first semiconductor region and the second semiconductor region and has a larger resistance value than the first semiconductor region and the second semiconductor region.

4. The semiconductor device according to claim 1,
wherein the first protection circuit functions if amplitude of AC voltage generated in the antenna is a first amplitude or higher,
wherein the second protection circuit functions if the amplitude of the AC voltage generated in the antenna is a second amplitude or higher, and
wherein the first amplitude is higher than the second amplitude.

5. The semiconductor device according to claim 1, further comprising a demodulation circuit, a constant voltage circuit, a logic circuit, and a modulation circuit,
wherein an input terminal of the demodulation circuit is electrically connected to the antenna,
wherein an input terminal of the constant voltage circuit is electrically connected to the output terminal of the rectifier circuit,
wherein a first input terminal of the logic circuit is electrically connected to an output terminal of the demodulation circuit, and a second input terminal of the logic circuit is electrically connected to an output terminal of the constant voltage circuit, and
wherein an input terminal of the modulation circuit is electrically connected to an output terminal of the logic circuit, and an output terminal of the modulation circuit is electrically connected to the antenna.

6. A semiconductor device comprising:
an antenna;
a rectifier circuit electrically connected to the antenna;
a first protection circuit; and
a second protection circuit,
wherein a first terminal of the first protection circuit is electrically connected to the antenna, and a second terminal of the first protection circuit is grounded,
wherein a first terminal of the second protection circuit is electrically connected to an output terminal of the rectifier circuit, a second terminal of the second protection circuit is electrically connected to the antenna, and a third terminal of the second protection circuit is grounded,
wherein the first protection circuit includes a plurality of first diodes connected in series and a plurality of second diodes connected in series,
wherein the second protection circuit includes a capacitor and a transistor, wherein an anode of the plurality of first diodes is electrically connected to the antenna, and a cathode of the plurality of first diodes is grounded,
wherein a cathode of the plurality of second diodes is electrically connected to the antenna, an anode of the plurality of second diodes is grounded,
wherein the plurality of second diodes is connected in parallel with the plurality of first diodes,
wherein one of electrodes of the capacitor is electrically connected to the antenna,
wherein a gate electrode of the transistor is electrically connected to the output terminal of the rectifier circuit,
wherein one of a source electrode and a drain electrode of the transistor is electrically connected to the other of the electrodes of the capacitor, and
wherein the other of the source electrode and the drain electrode of the transistor is grounded.

7. The semiconductor device according to claim 6,
wherein the second protection circuit includes a filter resistor and a filter capacitor,
wherein one of the ends of the filter resistor is electrically connected to the output terminal of the rectifier circuit, and the other of the ends of the filter resistor is electrically connected to the gate electrode of the transistor, and
wherein one of electrodes of the filter capacitor is electrically connected to the gate electrode of the transistor and the other of the ends of the filter resistor, and the other of the electrodes of the filter capacitor is grounded.

8. The semiconductor device according to claim 6,
wherein each of the plurality of first diodes and the plurality of second diodes is a PIN diode,
wherein the PIN diode includes a first semiconductor region, a second semiconductor region, and a third semiconductor region on the same plane,
wherein the first semiconductor region contains an impurity element which imparts one conductivity type,
wherein the second semiconductor region contains an impurity element which imparts a conductivity type opposite to that of the impurity element, and
wherein the third semiconductor region is interposed between the first semiconductor region and the second semiconductor region and has a larger resistance value than the first semiconductor region and the second semiconductor region.

9. The semiconductor device according to claim 6,
wherein the first protection circuit functions if amplitude of AC voltage generated in the antenna is a first amplitude or higher,
wherein the second protection circuit functions if the amplitude of the AC voltage generated in the antenna is a second amplitude or higher, and
wherein the first amplitude is higher than the second amplitude.

10. The semiconductor device according to claim 6, further comprising a demodulation circuit, a constant voltage circuit, a logic circuit, and a modulation circuit,
wherein an input terminal of the demodulation circuit is electrically connected to the antenna,
wherein an input terminal of the constant voltage circuit is electrically connected to the output terminal of the rectifier circuit,
wherein a first input terminal of the logic circuit is electrically connected to an output terminal of the demodulation circuit, and a second input terminal of the logic circuit is electrically connected to an output terminal of the constant voltage circuit, and wherein an input terminal of the modulation circuit is electrically connected to an output terminal of the logic circuit, and an output terminal of the modulation circuit is electrically connected to the antenna.

11. A semiconductor device comprising:
an antenna;
a rectifier circuit electrically connected to the antenna;
a first protection circuit; and
a second protection circuit,
wherein a first terminal of the first protection circuit is electrically connected to the antenna, and a second terminal of the first protection circuit is grounded,
wherein a first terminal of the second protection circuit is electrically connected to an output terminal of the rectifier circuit, a second terminal of the second protection circuit is electrically connected to the antenna, and a third terminal of the second protection circuit is grounded,
wherein the first protection circuit includes a first diode and a second diode,
wherein the second protection circuit includes a first resistor, a voltage divider diode, a p-channel transistor, a second resistor, a capacitor, and an n-channel transistor,
wherein an anode of the first diode is electrically connected to the antenna, and a cathode of the first diode is grounded,
wherein a cathode of the second diode is electrically connected to the antenna, an anode of the second diode is grounded, and the second diode is connected in parallel with the first diode,
wherein one of the ends of the first resistor is electrically connected to the output terminal of the rectifier circuit,
wherein an anode of the voltage divider diode is electrically connected to the other of the ends of the first resistor, and a cathode of the voltage divider diode is grounded,
wherein a gate electrode of the p-channel transistor is electrically connected to the other of the ends of the first resistor and the anode of the voltage divider diode,
wherein one of a source electrode and a drain electrode of the p-channel transistor is electrically connected to the output terminal of the rectifier circuit,
wherein one of the ends of the second resistor is electrically connected to the other of the source electrode and the drain electrode of the p-channel transistor, and the other of the ends of the second resistor is grounded,
wherein one of electrodes of the capacitor is electrically connected to the antenna,
wherein a gate electrode of the n-channel transistor is electrically connected to the other of the source electrode and the drain electrode of the p-channel transistor and the one of the ends of the second resistor,
wherein one of a source electrode and a drain electrode of the n-channel transistor is electrically connected to the other of the electrodes of the capacitor, and
wherein the other of the source electrode and the drain electrode of the n-channel transistor is grounded.

12. The semiconductor device according to claim 11,
wherein the second protection circuit includes a filter resistor and a filter capacitor,
wherein one of the ends of the filter resistor is electrically connected to the other of the source electrode and the drain electrode of the p-channel transistor and the one of the ends of the second resistor,
wherein the other of the ends of the filter resistor is electrically connected to the gate electrode of the n-channel transistor, and wherein one of electrodes of the filter capacitor is electrically connected to the gate electrode of the n-channel transistor and the other of the ends of the filter resistor, and the other of the electrodes of the filter capacitor is grounded.

13. The semiconductor device according to claim 11,
wherein each of the first diode and the second diode is a PIN diode,
wherein the PIN diode includes a first semiconductor region, a second semiconductor region, and a third semiconductor region on the same plane,
wherein the first semiconductor region contains an impurity element which imparts one conductivity type,
wherein the second semiconductor region contains an impurity element which imparts a conductivity type opposite to that of the impurity element, and
wherein the third semiconductor region is interposed between the first semiconductor region and the second semiconductor region and has a larger resistance value than the first semiconductor region and the second semiconductor region.

14. The semiconductor device according to claim 11, wherein the voltage divider diode is a diode-connected transistor.

15. The semiconductor device according to claim 11,
wherein the first protection circuit functions when amplitude of AC voltage generated in the antenna is a first amplitude or higher,
wherein the second protection circuit functions when the amplitude of the AC voltage generated in the antenna is a second amplitude or higher, and
wherein the first amplitude is higher than the second amplitude.

16. The semiconductor device according to claim 11, further comprising a demodulation circuit, a constant voltage circuit, a logic circuit, and a modulation circuit,
wherein an input terminal of the demodulation circuit is electrically connected to the antenna,
wherein an input terminal of the constant voltage circuit is electrically connected to the output terminal of the rectifier circuit,
wherein a first input terminal of the logic circuit is electrically connected to an output terminal of the demodulation circuit, and a second input terminal of the logic circuit is electrically connected to an output terminal of the constant voltage circuit, and
wherein an input terminal of the modulation circuit is electrically connected to an output terminal of the logic circuit, and an output terminal of the modulation circuit is electrically connected to the antenna.

17. A semiconductor device comprising:
an antenna;
a rectifier circuit electrically connected to the antenna;
a first protection circuit; and
a second protection circuit,
wherein a first terminal of the first protection circuit is electrically connected to the antenna, and a second terminal of the first protection circuit is grounded,
wherein a first terminal of the second protection circuit is electrically connected to an output terminal of the rectifier circuit, a second terminal of the second protection circuit is electrically connected to the antenna, and a third terminal of the second protection circuit is grounded,
wherein the first protection circuit includes a plurality of first diodes connected in series and a plurality of second diodes connected in series, wherein the second protection circuit includes a first resistor, a voltage divider diode, a p-channel transistor, a second resistor, a capacitor, and an n-channel transistor, wherein an anode of the plurality of first diodes is electrically connected to the antenna, and a cathode of the plurality of first diodes is grounded, wherein a cathode of the plurality of second diodes is electrically connected to the antenna, an anode of the plurality of second diodes is grounded, wherein the plurality of second diodes is connected in parallel with the plurality of first diodes, wherein one of the ends of the first resistor is electrically connected to the output terminal of the rectifier circuit, wherein an anode of the voltage divider diode is electrically connected to the other of the ends of the first resistor, and a cathode of the voltage divider diode is grounded, wherein a gate electrode of the p-channel transistor is electrically connected to the other of the ends of the first resistor and the anode of the voltage divider diode, wherein one of a source electrode and a drain electrode of the p-channel transistor is electrically connected to the output terminal of the rectifier circuit, wherein one of the ends of the second resistor is electrically connected to the other of the source electrode and the drain electrode of the p-channel transistor, and the other of the ends of the second resistor is grounded, wherein one of electrodes of the capacitor is electrically connected to the antenna, wherein a gate electrode of the n-channel transistor is electrically connected to the other of the source electrode and the drain electrode of the p-channel transistor and the one of the ends of the second resistor, wherein one of a source electrode and a drain electrode of the n-channel transistor is electrically connected to the other of the electrodes of the capacitor, and wherein the other of the source electrode and the drain electrode of the n-channel transistor is grounded.

18. The semiconductor device according to claim 17,
wherein the second protection circuit includes a filter resistor and a filter capacitor, wherein one of the ends of the filter resistor is electrically connected to the other of the source electrode and the drain electrode of the p-channel transistor and the one of the ends of the second resistor, wherein the other of the ends of the filter resistor is electrically connected to the gate electrode of the n-channel transistor, and wherein one of electrodes of the filter capacitor is electrically connected to the gate electrode of the n-channel transistor and the other of the ends of the filter resistor, and the other of the electrodes of the filter capacitor is grounded.

19. The semiconductor device according to claim 17,
wherein each of the plurality of first diodes and the plurality of second diodes is a PIN diode, wherein the PIN diode includes a first semiconductor region, a second semiconductor region, and a third semiconductor region on the same plane, wherein the first semiconductor region contains an impurity element which imparts one conductivity type, wherein the second semiconductor region contains an impurity element which imparts a conductivity type opposite to that of the impurity element, and wherein the third semiconductor region is interposed between the first semiconductor region and the second semiconductor region and has a larger resistance value than the first semiconductor region and the second semiconductor region.

20. The semiconductor device according to claim 17, wherein the voltage divider diode is a diode-connected transistor.

21. The semiconductor device according to claim 17,
wherein the first protection circuit functions when amplitude of AC voltage generated in the antenna is a first amplitude or higher, wherein the second protection circuit functions when the amplitude of the AC voltage generated in the antenna is a second amplitude or higher, and wherein the first amplitude is higher than the second amplitude.

22. The semiconductor device according to claim 17, further comprising a demodulation circuit, a constant voltage circuit, a logic circuit, and a modulation circuit, wherein an input terminal of the demodulation circuit is electrically connected to the antenna, wherein an input terminal of the constant voltage circuit is electrically connected to the output terminal of the rectifier circuit, wherein a first input terminal of the logic circuit is electrically connected to an output terminal of the demodulation circuit, and a second input terminal of the logic circuit is electrically connected to an output terminal of the constant voltage circuit, and wherein an input terminal of the modulation circuit is electrically connected to an output terminal of the logic circuit, and an output terminal of the modulation circuit is electrically connected to the antenna.

* * * * *